(12) United States Patent
Li

(10) Patent No.: US 11,005,433 B2
(45) Date of Patent: May 11, 2021

(54) CONTINUOUS-MODE HARMONICALLY TUNED POWER AMPLIFIER OUTPUT NETWORKS AND SYSTEMS INCLUDING SAME

(71) Applicant: Georgia Tech Research Corporation, Atlanta, GA (US)

(72) Inventor: Tso-Wei Li, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 102 days.

(21) Appl. No.: 16/273,883

(22) Filed: Feb. 12, 2019

(65) Prior Publication Data

US 2019/0253027 A1 Aug. 15, 2019

Related U.S. Application Data

(60) Provisional application No. 62/629,333, filed on Feb. 12, 2018.

(51) Int. Cl.
| | |
|---|---|
| *H03F 3/68* | (2006.01) |
| *H03F 3/21* | (2006.01) |
| *H03F 3/00* | (2006.01) |
| *H03F 1/56* | (2006.01) |
| *H03F 3/24* | (2006.01) |
| *H03F 3/191* | (2006.01) |
| *H03F 3/26* | (2006.01) |

(52) U.S. Cl.
CPC ............ *H03F 3/21* (2013.01); *H03F 1/565* (2013.01); *H03F 3/005* (2013.01); *H03F 3/191* (2013.01); *H03F 3/245* (2013.01); *H03F 3/26* (2013.01); *H03F 3/68* (2013.01); *H03F 2200/318* (2013.01); *H03F 2200/451* (2013.01); *H03F 2200/534* (2013.01); *H03F 2200/537* (2013.01)

(58) Field of Classification Search
CPC . H03F 3/21; H03F 1/565; H03F 3/245; H03F 3/191; H03F 3/005; H03F 2200/318; H03F 2200/537; H03F 2200/451; H03F 2200/534; H03F 3/38; H03F 1/08; H03F 3/02; H03F 2200/541; H01F 19/02; H01B 11/16
USPC .......................... 330/188, 190, 79, 165, 195
See application file for complete search history.

(56) References Cited

U.S. PATENT DOCUMENTS

| | | | | |
|---|---|---|---|---|
| 6,501,335 B2* | 12/2002 | Kakuta | ................... | H03F 3/191 |
| | | | | 330/302 |
| 9,923,525 B2* | 3/2018 | Matsuno | ............. | H01L 27/0255 |
| 10,110,184 B2* | 10/2018 | Lyalin | .................. | H03F 3/3098 |

(Continued)

OTHER PUBLICATIONS

Mortazavi, et al., "A class F-1 /F 24-to-31GHz power amplifier with 40.7% peak PAE, 15dBm OP1dB, and 50mW Psat in 0.13μm SiGe BiCMOS," ISSCC, 2014.

(Continued)

*Primary Examiner* — Khanh V Nguyen
(74) *Attorney, Agent, or Firm* — Troutman Pepper Hamilton Sanders LLP; Ryan A. Schneider

(57) ABSTRACT

The disclosed technology can include a power amplifier comprising an input, an output, and a transformer. The power amplifier can include a primary inductor coil coupled to the input, a secondary inductor coil coupled to the output, and three harmonic branches coupled to the primary coil. Each branch can comprise at least one electrical component having a tunable impedance.

19 Claims, 23 Drawing Sheets

(56) References Cited

U.S. PATENT DOCUMENTS

2008/0164941 A1* 7/2008 Lee .................... H03F 3/45475
330/124 R
2016/0268978 A1* 9/2016 Matsuno ............. H01L 27/0255

OTHER PUBLICATIONS

Chen and Peroulis, "Design of broadband highly efficient harmonic-tuned power amplifier using in-band continuous Class-F-1/F mode Transferring," IEEE Trans. on Microw. Theory and Techn. (T-MTT), Dec. 2012, vol. 60, No. 12, pp. 4107-4116.

* cited by examiner

| | Power Amplifier 100 | Prior Art 1 | Prior Art 2 | Prior Art 3 | Prior Art 4 | Prior Art 5 | Prior Art 6 | Prior Art 7 |
|---|---|---|---|---|---|---|---|---|
| Technology | 130nm SiGe | 65nm CMOS | 130nm SiGe | 40nm CMOS | 130nm SiGe | 28nm CMOS | 28nm CMOS | 28nm CMOS |
| PA supply (V) | 1.9 | 1.1 | 3.6 | 1.1 | 1.5 | 2.2 | 1 | 0.9 |
| Frequency (GHz) | 19-29.5 | 28-34 | 27-29 | 27-30* | 28-42 | 26.5-29* | 28-33* | 25-46* |
| $P_{sat}$ 1dB Bandwidth | 43.3% | 26.7% | 7.1% | 10.5%* | 46% | 10.7%* | 22.2%* | 63%* |
| Gain (dB) | 20 | 10 | 15.5 | 22.4 | 18.2 | 13.6 | 22 | 20.8 |
| $P_{1dB}$ (dBm) | 17 | 14.8 | 18.8 | 13.1 | 16.8 | 19.8 | 19.8 | 16 |
| $P_{sat}$ (dBm) | 15.2 | 13.2 | 15.9 | 13.7 | 15.1 | 18.6 | 16 | 13.4 |
| $PAE_{max}$ (%) (2-stage PA) | 43.5 | - | - | 30.7 | 22.8 | - | 21 | 24.2 |
| $PAE_{max}$ (%) (1-stage PA) | 50 | 46.4 | 35.3 | 31.1 | 21.6 | 43.3 | - | - |
| $PAE_{1dB}/P_{sat}$ (%) | 39.2 | 36* | 31.5 | - | - | - | 12.6 | 12.6 |
| $PAE_{out}/P_{sat}$ (%) | 43 | - | - | - | - | 41.4 | - | - |
| Modulation scheme | 64-QAM / 256-QAM | - | 16-QAM OFDM | 64-QAM OFDM | 64-QAM | 64-QAM WLAN | 64-QAM | 64-QAM |
| Data rate (Gb/s) | 6 / 9 / 18 / 4 / 6.4 / 8 | - | 3.2 | 4.9 | 6 | 0.48 | 15 | 6 |
| EVM (dB) | -27.6 / -26.8 / -25 / -31.3 / -30.5 / -30.5 | - | -22 | -25 | -26.6 | -27.5 | -25 | -25 |
| $P_{out}$ @EVM (dBm) | 10.7 / 10.7 / 9.8 / 8.8 / 8.9 / 8.7 | - | - | 6.7 | 7.2 | 10.97 | 11.7 | 5.9 |
| $PAE_{out}$ @EVM (%) (2-stage PA) | 21.4 / 21.5 / 19.4 / 16.2 / 10.7 / 16.3 | - | - | 1.1 | 7.9 | 17.3 | 3.75 | 2.3 |
| PA core size (mm²) | 0.29 | 0.12 | 0.27 | 0.23 | 1.76 | 0.28 | 0.59 | 0.16 |
| Topology | Differential 2-stage Continuous-mode Harmonically-tuned | Single-ended 1-stage Continuous-mode Class-F | Single-ended 1-stage Cascode Continuous-mode Class-AB | Single-ended 3-stage Class-AB | Single-ended 2-stage Doherty | Single-ended 1-stage 2-stacked Harmonically-tuned Class-AB | Single-ended 2-stage Doherty | Single-ended 2-stage Class-AB with Output Power Combiner |

*$PAE_{DC}$: includes the DC power consumption of both driver and PA stage
**$PAE_{out}$: includes the DC power consumption of the output PA stage only
*Graphically estimated from reported figures

FIG. 6

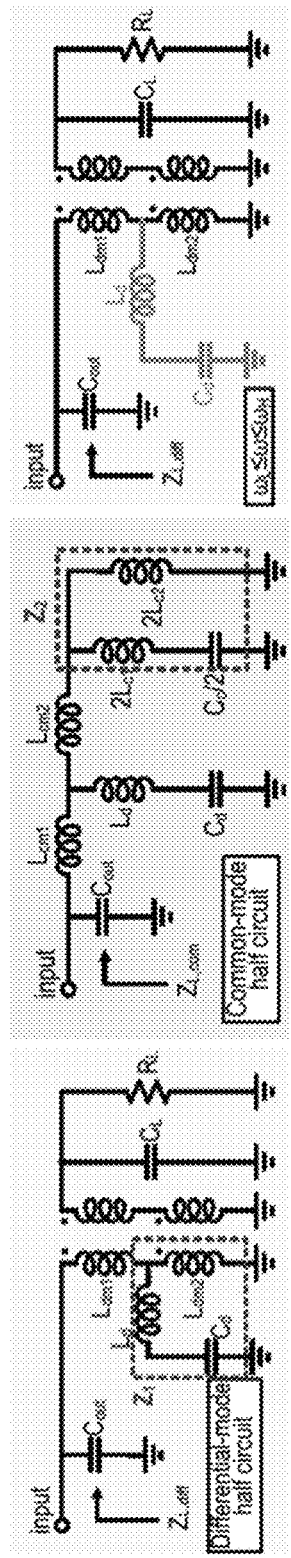
FIG. 8A  FIG. 8B  FIG. 8C
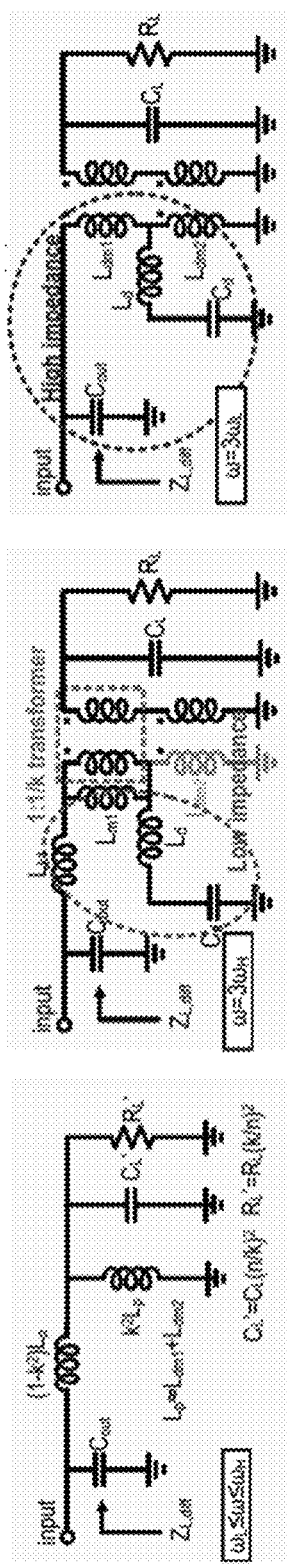
FIG. 8D  FIG. 8E  FIG. 8F
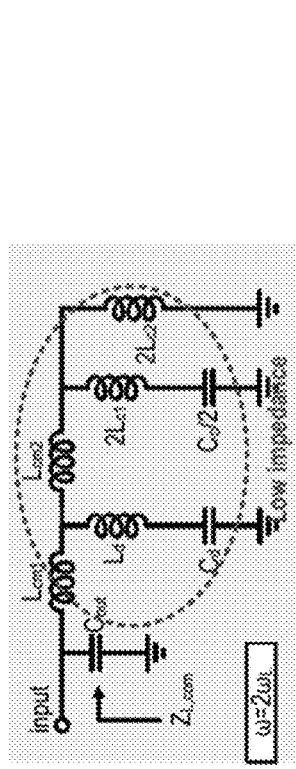
FIG. 8G
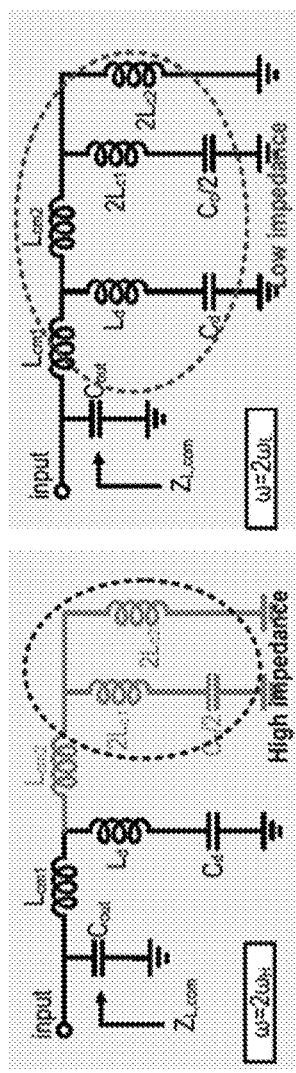
FIG. 8H

PA LOAD IMPEDANCE BEHAVIORS FOR DIFFERENT OPERATIONS

| Operation | | Fundamental Impedance | | 2nd harmonic Impedance | | 3rd harmonic Impedance | |
|---|---|---|---|---|---|---|---|
| | | $|Z_1|$ | $\angle Z_1$ | $|Z_2|$ | $\angle Z_2$ | $|Z_3|$ | $\angle Z_3$ |
| Class-F | $\gamma=0$ | $R_{opt,F}$ | 0 | Low | 0 | High | 0 |
| Class-F⁻¹ | $\xi=0$ | $R_{opt,IF}$ | 0 | High | 0 | Low | 0 |
| Continuous-Class-F | $\gamma>0$ | $R_{opt,F}$ | Capacitive | Low | Inductive | High | either |
| | $\gamma<0$ | $R_{opt,F}$ | Inductive | Low | Capacitive | | |
| Continuous-Class-F⁻¹ | $\xi>0$ | $R_{opt,IF}$ | Inductive | High | Capacitive | Low | either |
| | $\xi<0$ | $R_{opt,IF}$ | Capacitive | High | Inductive | | |

FIG. 10

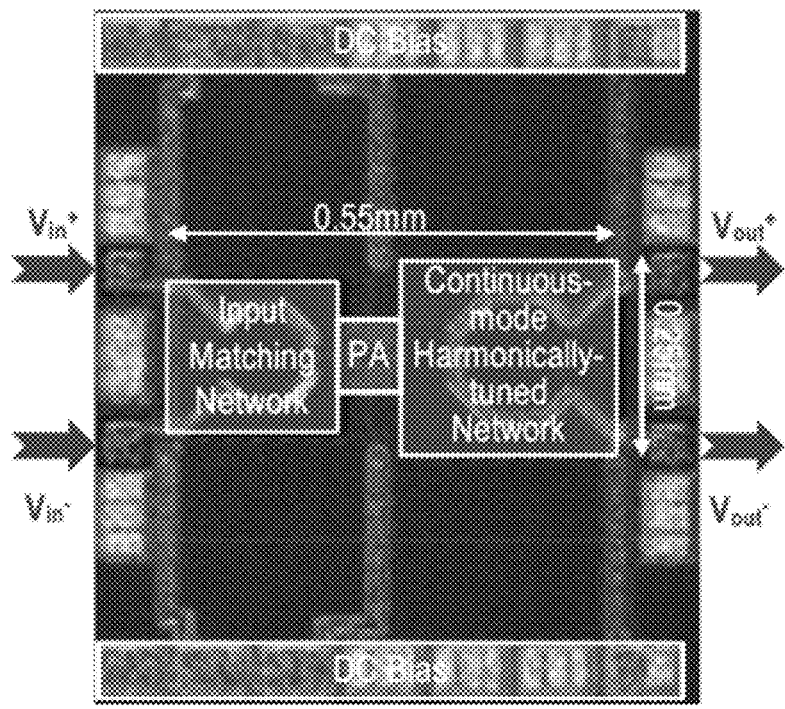

FIG. 11

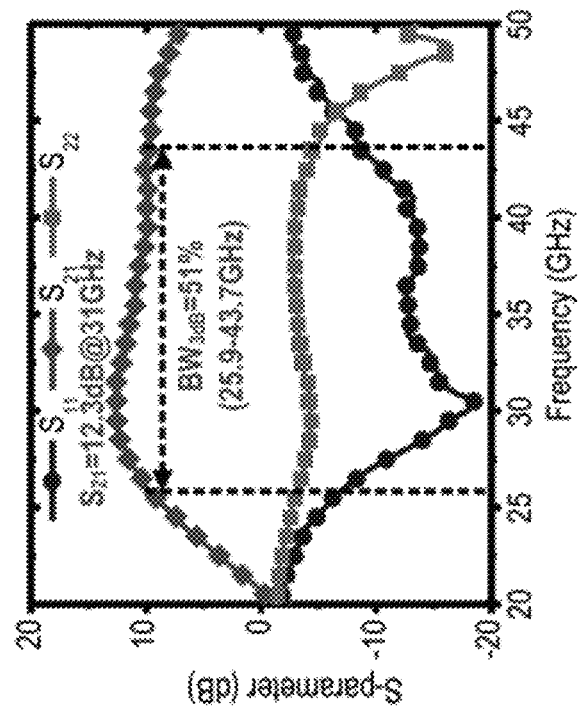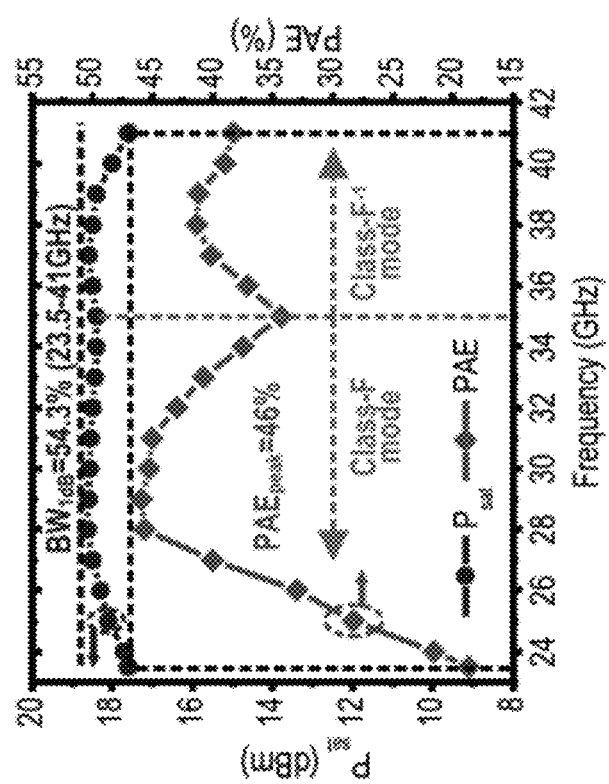
FIG. 13

COMPARISON OF STATE-OF-THE-ART SILICON-BASED MM-WAVE PAS AT RELATED FREQUENCIES

| Author | $P_{out,1dB}$ Frequency (GHz) | $P_{out,1dB}$ Bandwidth (%) | $P_{sat}$ (dBm) | PAE (%) | Gain (dB) | $P_{1dB}$ (dBm) | Core size (mm²) | Process | Topology |
|---|---|---|---|---|---|---|---|---|---|
| Power Amplifier 800a | 22.5-41 | 54.3 | 18.5@28GHz 18.6@37GHz 18.5@39GHz | 45.7@28GHz 40.2@37GHz 41.2@39GHz | 11.4@28GHz 10.7@37GHz 10.5@39GHz | 18.6@28GHz 16.3@37GHz 16.3@39GHz | 0.14 | 45nm SOI CMOS | Hybrid of Continuous Class-F/F⁻¹ |
| Prior Art 1 | 26-34 | 26.7 | 14.75 | 46.4 | 10 | 13.2 | 0.12 | 65nm CMOS | Continuous Class-F |
| Prior Art 2 | 19-29.5 | 43.3 | 17 | 43.5 | 20 | 15.2 | 0.29 | 130nm SiGe | Continuous Class-F⁻¹ |
| Prior Art 3 | 27-39 | 7.1 | 18.8 | 35.3 | 15.5 | 15.9 | 0.27 | 130nm SiGe | Continuous Class-AB |
| Prior Art 4 | 25-48* | 63* | 18.8 | 24.2 | 20.8 | 13.4 | 0.16 | 28nm CMOS | Class-AB w/ Output Power Combiner |
| Prior Art 5 | 28-35* | 22.2* | 19.8 | 21 | 22 | 16 | 0.59 | 28nm CMOS | Doherty |
| Prior Art 6 | 28-42 | 40 | 16.9@28GHz 17.1@37GHz 17@38GHz | 20.3@28GHz 22.6@37GHz 21.4@39GHz | 18.2@28GHz 17.1@37GHz 18.6@39GHz | 15.2@28GHz 15.5@37GHz 5.4@38GHz | 1.78 | 130nm SiGe | Doherty |
| Prior Art 7 | 24-31 | 25.5 | 17.1 | 40 | 13.3 | 15 | 0.27 | 130nm SiGe | Hybrid of Class-F²/F |

*Graphically estimated from reported figures

FIG. 14

CONTINUOUS-MODE HARMONICALLY TUNED POWER AMPLIFIER OUTPUT NETWORKS AND SYSTEMS INCLUDING SAME

CROSS-REFERENCE TO RELATED APPLICATION

This application claims the benefit of U.S. Provisional Application No. 62/629,333, entitled "Harmonically Tuned Output Matching Network for Power Amplifier," filed Feb. 12, 2018, the entire contents and substance of which are fully incorporated herein by reference.

TECHNICAL FIELD

The present disclosure relates generally to power amplifiers. More particularly, the present invention is directed to continuous-mode harmonically tuned power amplifiers.

BACKGROUND

With the rapid growth of fifth generation (5G) communication, multiple frequency bands have been proposed for use as 5G spectrums in countries and regions around the world. Notably, various countries and regions have proposed the use of 5G spectrums across a wide range of frequencies, and these various frequency ranges tend to be noncontinuous. For example, various countries or regions have proposed to use 5G spectrums in the 24 GHz band, 28 GHz band, 37 GHz band, and 39 GHz band. The wide range of proposed frequencies may provide significant technical obstacles as existing hardware, which may be suitable for a particular frequency band, may be unsuitable for other frequency bands due to, for example, providing insufficient saturated power output, power-added efficiency, and/or power gain. These obstacles may be exacerbated by the noncontiguous nature of the proposed frequency bands, emphasizing a need for different technical attributes for each country or region.

Additionally, 5G mm-Wave systems are expected to support wideband spectrum-efficient modulations (e.g., 64-QAM and 256-QAM) to achieve GB per second (Gb/s) link throughput. These complex modulation schemes, however, often come with high-density constellations that demand stringent linearity (e.g., large-signal AM-AM and AM-PM distortion) on the power amplifiers. Thus, to support future wideband multiple input/multiple output (MIMO) networks, desired mm-Wave silicon-based power amplifier solutions should offer wide carrier bandwidth, high efficiency, high linearity, sufficient output power, and simultaneously compact size. Further, both SiGe and CMOS power amplifiers may exhibit upper performance envelopes for peak power-added efficiency (PAE) versus saturated output power ($P_{sat}$), showing a "device limited regime" in the low and medium $P_{sat}$ regions, which may be determined by the intrinsic power device efficiency, and a "circuit/combiner limited regime" in the medium and high $P_{sat}$ regions, which may be governed by the combiner efficiency.

Moreover, existing designs may face a trade-off between necessary attributes. For example, existing mm-wave power amplifiers typically face a trade-off between power amplifier efficiency and linearity. Basic linear power amplifiers (e.g., Class-A and Class-AB power amplifiers) may offer design simplicity and good linearity, but their simple, "all-short" output harmonic terminations may limit their peak efficiency. On the other hand, mm-Wave time-domain switching power amplifiers (e.g., Class-E power amplifiers) may provide high peak efficiency but may also provide limited linearity. This may be because mm-Wave time-domain switching power amplifiers cannot support complex modulations without major digital pre-distortion. Notably, digital pre-distortion at Gb/s link throughput may require substantial power and complexity for 5G communications. Further, advanced architectures, such as Doherty power amplifiers and outphasing power amplifiers, may provide increased back-off efficiency for mm-wave 5G applications. These solutions, however, also carry practical shortcomings as Doherty power amplifiers often require a large physical area, and outphasing power amplifiers may demand extensive digital pre-distortion. Further still, overdriven linear power amplifiers with harmonically-tuned impedance terminations fail to fully solve the efficiency-linearity challenges. For example, Class-AB, Class-J, Class-F, and inverse Class-F (Class $F^{-1}$) harmonic terminations on linear power amplifiers may increase the peak efficiency while preserving high linearity, but each of these designs may either provide limited bandwidth due to narrowband harmonic terminations or require area-consuming passive networks, which may practically restrict or prevent their use in broadband MIMO systems.

Therefore, there is a need for an ultra-broadband (e.g., covering a wide array of 5G frequency bands) mm-wave transmitter that can enable frequency diversity and international roaming across various 5G networks, as well as supporting wideband MIMOs with ultra-compact elements without requiring assembly of numerous single-band transmitters.

BRIEF SUMMARY

The presently disclosed technology addresses these and other considerations. The disclosed technology includes a power amplifier. The continuous mode power amplifier can comprise a transformer-based, ultra-compact, continuous-mode, Class-F/$F^{-1}$ power amplifier output network, and the disclosed technology may simultaneously achieve wide bandwidth, high efficiency, and compact form-factor.

The disclosed technology may include a power amplifier comprising an input, an output, and a transformer. The transform can include a primary inductor coil coupled to the input, a secondary inductor coil coupled to the output, and three harmonic branches coupled to the primary coil. Each branch can include at least one electrical component having a tunable impedance, and the power amplifier can be configured to operate at an operating frequency.

The transformer can be a 1:1 transformer.

At least one electrical component of at least one branch can be a capacitor.

The primary inductor coil can be symmetrically positioned within the transformer with respect to the secondary inductor coil.

The power amplifier can have a footprint area of less than or equal to approximately 0.14 mm$^2$.

The power amplifier can be configured to operate in both a common mode and a differential mode.

The power amplifier can be configured to operate in both the common mode and the differential mode simultaneously.

The power amplifier can have a hybrid Class F/Class F-1 topology.

The power amplifier can have a fractional bandwidth of approximately 54.3%.

The power amplifier can have a peak power-added efficiency that is between approximately 33% and approximately 50% when the operating frequency is between approximately 28 GHz and approximately 45 GHz.

The power amplifier can have a saturated power output of between approximately 18.6 dBm and approximately 28 dBm, a peak power-added efficiency of between approximately 30% and approximately 46%, and a power gain between approximately 10 dB and approximately 25 dB when the operating frequency is approximately 28 GHz.

The power amplifier can have a saturated power output of between approximately 18.6 dBm and approximately 26 dBm, a peak power-added efficiency of between approximately 25% and approximately 42%, and a power gain of between approximately 10 dB and approximately 25 dB when the operating frequency is approximately 37 GHz.

The power amplifier can have a saturated power output of between approximately 18.5 dBm and approximately 26 dBm, a peak power-added efficiency of between approximately 25% and approximately 42%, and a power gain of between approximately 10 dB and approximately 25% when the operating frequency is approximately 39 GHz.

The power amplifier can have a saturated power output of between approximately 18.6 dBm and approximately 28 dBm, a peak power-added efficiency of between approximately 30% and approximately 46%, and a power gain between approximately 10 dB and approximately 25 dB when the operating frequency is approximately 28 GHz; a saturated power output of between approximately 18.6 dBm and approximately 26 dBm, a peak power-added efficiency of between approximately 25% and approximately 42%, and a power gain of between approximately 10 dB and approximately 25 dB when the operating frequency is approximately 37 GHz; and a saturated power output of between approximately 18.5 dBm and approximately 26 dBm, a peak power-added efficiency of between approximately 25% and approximately 42%, and a power gain of between approximately 10 dB and approximately 25% when the operating frequency is approximately 39 GHz.

The disclosed technology can include a power amplifier configured to simultaneously provide continuous-mode harmonic tuning at both a differential mode and a common mode, and the power amplifier can include a single 1:1 transformer including two symmetrically embedded inductor branches, three harmonic tuning capacitors coupled to the transformer and configured to provide third-order harmonic impedance tuning in the differential mode, and two extended inductor branches coupled to the transformer and configured to provide second-order harmonic impedance tuning in the common mode.

The power amplifier can also include two matching capacitors.

At least one of the extended inductor branches can have a length greater than a length of each of the symmetrically embedded inductor branches.

At least one of the extended inductor branches can have a length in the range of approximately 40 μm to approximately 120 μm.

The extended inductor branches can form a common mode tuning branch, and the symmetrically embedded inductor branches can form a differential mode tuning branch.

The disclosed technology can include a massive MIMO system comprising a power amplifier. The power amplifier can include a single 1:1 transformer including two symmetrically embedded inductor branches, three harmonic tuning capacitors electrically coupled to the transformer and configured to provide third-order harmonic impedance tuning in the differential mode, and two extended inductor branches electrically coupled to the transformer and configured to provide second-order harmonic impedance tuning in the common mode.

These and other aspects of the disclosed technology are described in the Detailed Description below and the accompanying figures. Other aspects and features of the disclosed technology will become apparent to those of ordinary skill in the art upon reviewing the following description of specific, example embodiments of the disclosed technology in concert with the figures. While features of the disclosed technology may be discussed relative to certain embodiments and figures, all embodiments of the disclosed technology can include one or more of the features discussed herein. Further, while one or more embodiments may be discussed as having certain advantageous features, one or more of such features may also be used with the other various embodiments of the disclosed technology. In similar fashion, while example embodiments may be discussed below as device, system, or method embodiments, it is to be understood that such example embodiments can be implemented in various devices, systems, and methods of the disclosed technology.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

FIG. 6 illustrates a comparison of performance metrics for an example power amplifier, in accordance the disclosed technology, and existing power amplifiers.

FIG. 8A illustrates a simplified half-circuit of a differential-mode of an example power amplifier output network, in accordance with the disclosed technology.

FIG. 8B illustrates a simplified half-circuit of a common-mode of an example power amplifier output network, in accordance with the disclosed technology.

FIG. 8C illustrates a simplified half-circuit of a common-mode of an example power amplifier output network at the fundamental frequency, in accordance with the disclosed technology.

FIG. 8D illustrates a simplified half-circuit of a fundamental equivalent circuit of a common-mode of an example power amplifier output network, in accordance with the disclosed technology.

FIG. 8E illustrates a simplified half-circuit of a third-harmonic of a lower band of an example power amplifier output network, in accordance with the disclosed technology.

FIG. 8F illustrates a simplified half-circuit of a third-harmonic of a higher band of an example power amplifier output network, in accordance with the disclosed technology.

FIG. 8G illustrates a simplified half-circuit of a second-harmonic of a lower band of an example power amplifier output network, in accordance with the disclosed technology.

FIG. 8H illustrates a simplified half-circuit of a second-harmonic of a higher band of an example power amplifier output network, in accordance with the disclosed technology.

FIG. 10 is a table indicating impedance behaviors for a continuous-mode hybrid Class-F and Class-$F^{-1}$ power amplifier, in accordance with the disclosed technology.

FIG. 11 is a chip microphotograph of an example power amplifier, in accordance with the disclosed technology.

FIG. 13 shows graphs illustrating measured S-parameters and the continuous-wave large-signal performance of an example power amplifier versus output power and carrier frequency, in accordance with the disclosed technology.

FIG. 14 illustrates a comparison of performance metrics for an example power amplifier, in accordance the disclosed technology, and existing power amplifiers.

DETAILED DESCRIPTION

To facilitate an understanding of the principles and features of the disclosed technology, various illustrative embodiments are explained below. To simplify and clarify explanation, the disclosed technology is described below as including continuous-mode harmonically tuned power amplifiers. One skilled in the art will recognize, however, that the disclosed technology is not so limited. For example, the disclosed technology contemplates various communications devices and MIMO networks including one or more continuous-mode harmonically tuned power amplifiers.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

As described above, there are considerable obstacles and shortcomings for existing power amplifiers, particularly in the context of 5G communications and/or 5G MIMO networks. In contrast to conventional single-frequency-power-amplifier harmonic tuning, a continuous-mode power amplifier can substantially expand the frequency range over which the desired power amplifier output harmonic terminations can be achieved for efficiency enhancement. However, existing continuous-mode power amplifier output networks typically require multiple passive components and/or transmission lines for multi-resonance tuning, which can increase the network complexity, losses, and size.

Figure 1A:
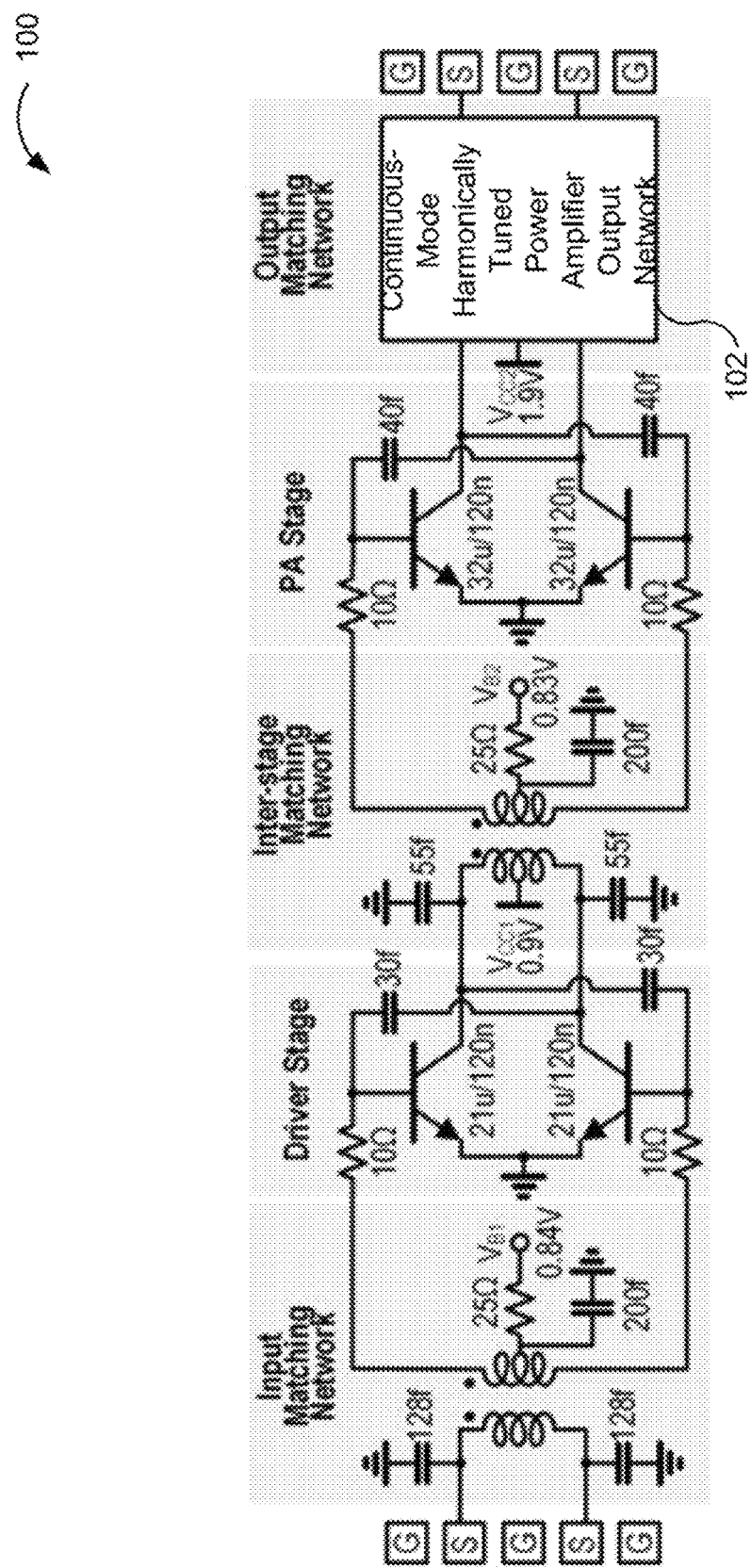
FIG. 1A is a schematic of an example power amplifier, in accordance with the disclosed technology.
Figure 1C:
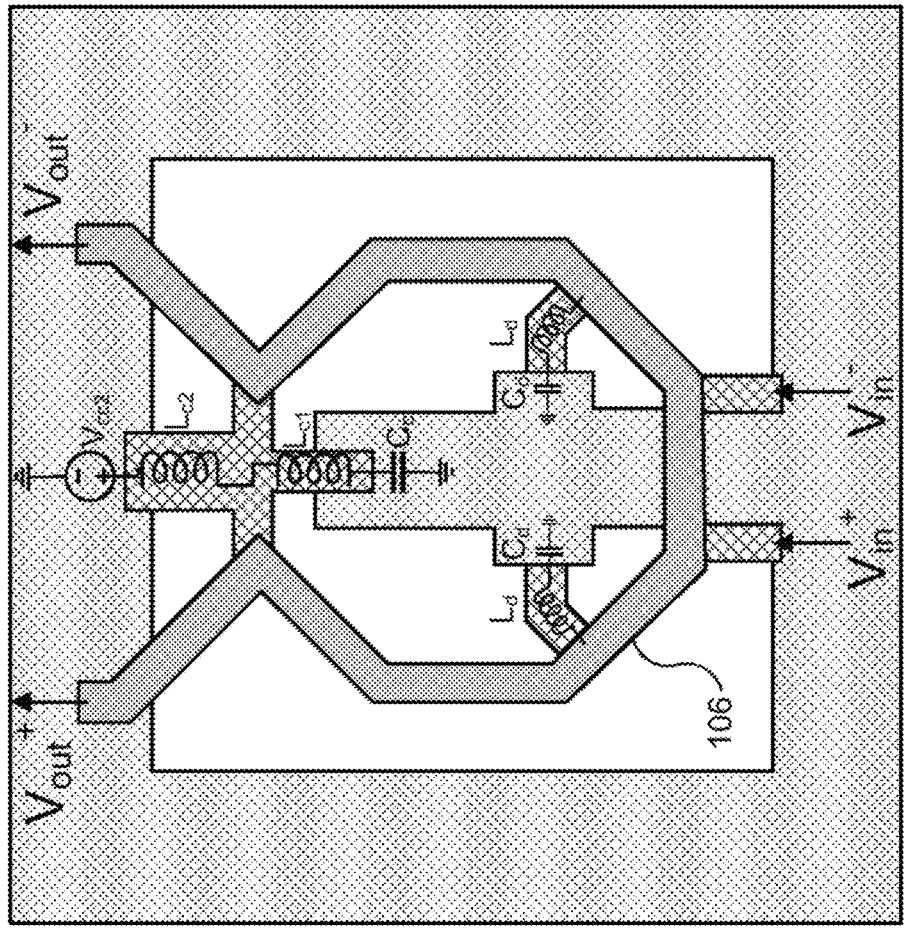
FIG. 1C is an EM model of an example power amplifier output network, in accordance with the disclosed technology.
Figure 1B:
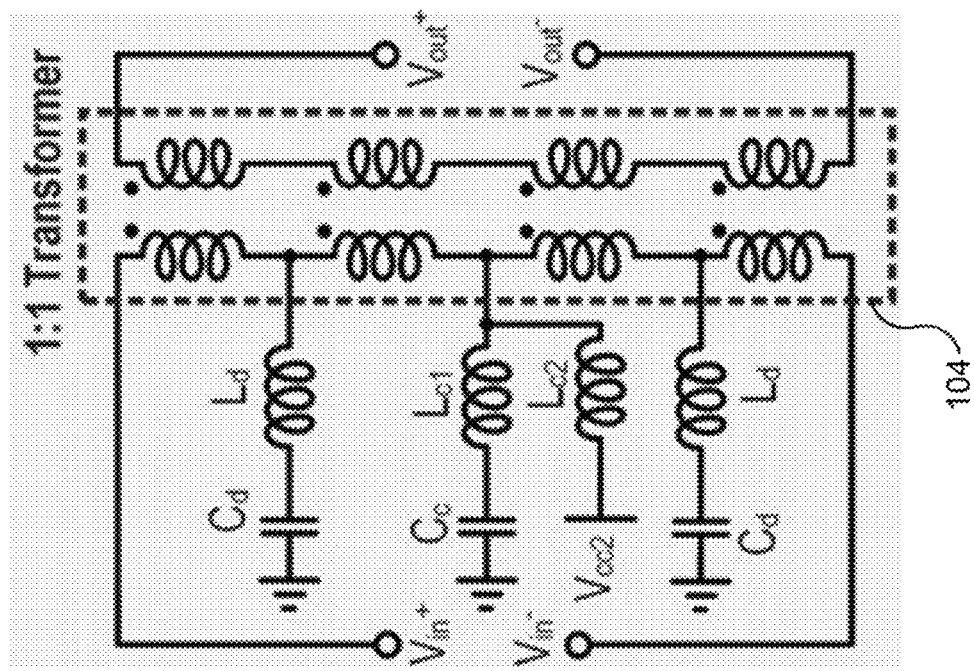
FIG. 1B is a simplified schematic of an example power amplifier output network, in accordance with the disclosed technology.

The disclosed technology can include a two-stage, differential, continuous-mode, harmonically tuned, ultra-linear, mm-wave power amplifier. Referring to FIGS. 1A-1C, the disclosed power amplifier 100 includes a power amplifier output network 102 configured to exploit and enhance parasitic elements in an on-chip transformer to achieve continuous-mode harmonic tuning at both a differential-mode and a common-mode, which may also result in substantial network simplification and/or component-level area-reduction. The power amplifier output network 102 can include a single (i.e., no more than one) 1:1 transformer 104, three harmonic tuning capacitors $C_c$, $C_d$, and two inductor coil branches $L_d$. The two inductor coil branches $L_d$ can be symmetrically embedded branches inside the transformer, which may provide third-order harmonic impedance tuning in differential-mode. The power amplifier output network 102 can include two extended inductor coil branches $L_{c1}$ and $L_{c2}$, which may provide second-order harmonic impedance tuning in common-mode. The power amplifier output network 102 may include a harmonic trap network at the power amplifier input (i.e., $V_{in}^+$ and $V_{in}^-$), which may provide a low second-order harmonic source impedance. "Low" impedance may refer to an impedance approximately 0.5 times lower than the fundamental impedance.

Figure 2:
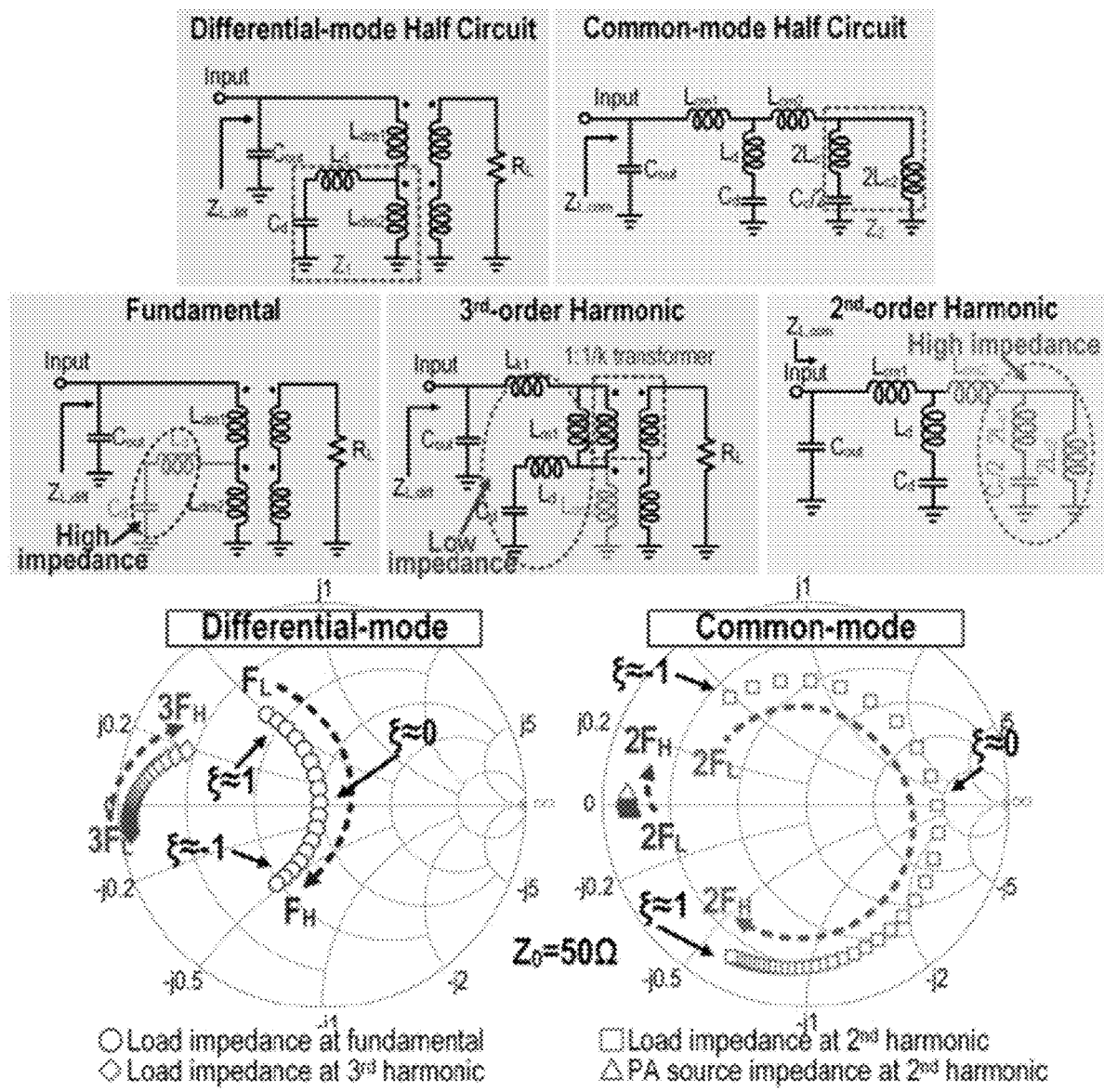
FIG. 2 illustrates simplified differential-mode and common-mode half circuits of an example power amplifier output network, in accordance with the disclosed technology.

FIG. 2 relates to the power amplifier output network's 102 output harmonic termination network is explained. There, $L_{dm1}/L_{cm1}$ and $L_{dm2}/L_{cm2}$ may indicate the differential-mode and common-mode half-circuit inductances of the transformer 104, and the output leads may be absorbed into the transformer secondary coil 106. $L_{m1}$ and $L_{k1}$ may be the magnetizing and leakage inductances of the transformer 104 in the differential-mode half-circuit, and in the differential mode, the center-tap of the transformer 104 may be virtual ground. Accordingly, $L_{c1}/L_{c2}$ and $C_c$ may not affect the fundamental termination and third-order harmonic termination. As will be appreciated, $C_d$-$L_d$-$L_{dm2}$ may form a multi-resonance tank $Z_1$ with high-frequency resonance. At the fundamental frequency, the series network Ca—La may behave as a small capacitor, which may present a high impedance to the transformer 104. The transformer 104 may perform its matching with the power amplifier output network's 102 output capacitance $C_{out}$ and may provide the desired fundamental load impedance to the power amplifier output network 102. At the third-order harmonic, the series network $C_d$-$L_d$ may be slightly below their series resonance, which may short out $L_{dm2}$ and form a series resonance of $C_d$-$L_d$-$L_{m1}$-$L_{k1}$ to produce a predetermined low impedance. In the common-mode half-circuit, the network of $C_c/2$, $2L_{c1}$, and $2_{Lc2}$ may form a multi-resonance tank $Z_2$. At the second-order harmonic, $Z_2$ can provide a high impedance, and the remaining series tank of $C_d$-$L_d$ can behave as a capacitor. Therefore, with proper tuning, the second-order harmonic impedance may be dominated by $C_{out}$, $L_{cm1}$, and the effective capacitance due to the series $C_d$-$L_d$, which may achieve the desired or predetermined continuous-mode second-order harmonic impedance. The trajectories of the half-circuit load impedance at the fundamental harmonics, second-order harmonics, and third-order harmonics with the power amplifier output capacitance $C_{out}$ are shown in the Smith chart FIG. 2.

Referring still to FIG. 2, the power amplifier continuous-mode harmonic terminations are further explained. The fundamental load impedance may be mostly inductive for lower frequencies (e.g., $0 \leq \xi \leq 1$) and may be mostly capacitive for higher frequencies (e.g., $-1 \leq \xi \leq 0$). Conversely, the second-order harmonic impedance may be mostly conductive for lower frequencies (e.g., $0 \leq \xi \leq 1$) and may be mostly inductive for higher frequencies (e.g., $-1 \leq \xi \leq 0$). The fundamental and the second-order harmonic impedances of the upper operation bandwidth may follow the constant conductance circles, while the third-order-harmonic impedance main remain relatively low. These aspects may verify that the disclosed power amplifier can achieve continuous-mode Class-$F^{-1}$-like harmonic terminations for its fundamental, second-, and third-order impedances. In addition, the harmonic trap and the inter-stage network may together provide a low second-order-harmonic source impedance for the power amplifier, which may ensure linearity of the power amplifier.

Figure 3:
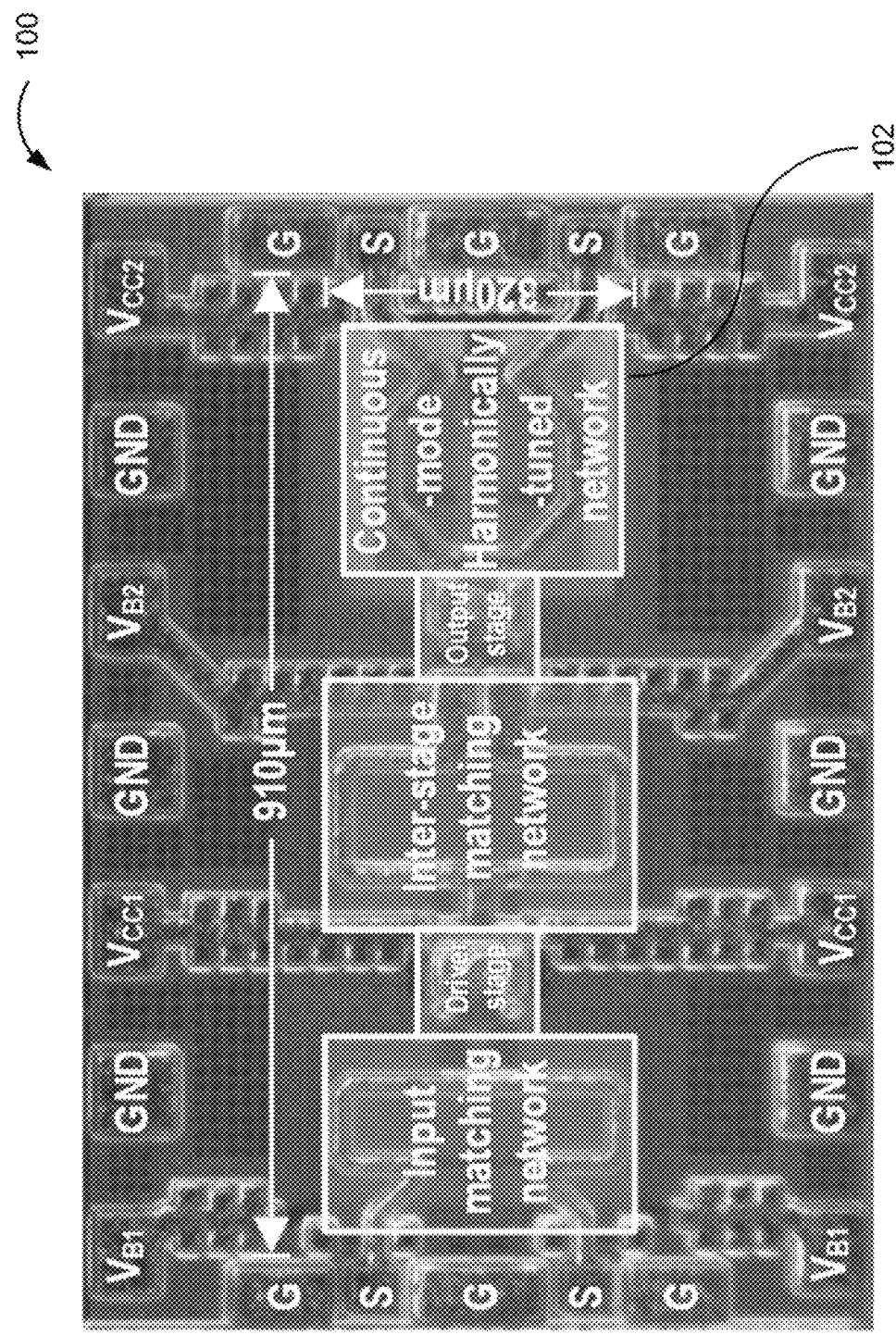
FIG. 3 illustrates die micrograph for an example power amplifier, in accordance with the disclosed technology.
Figure 4:
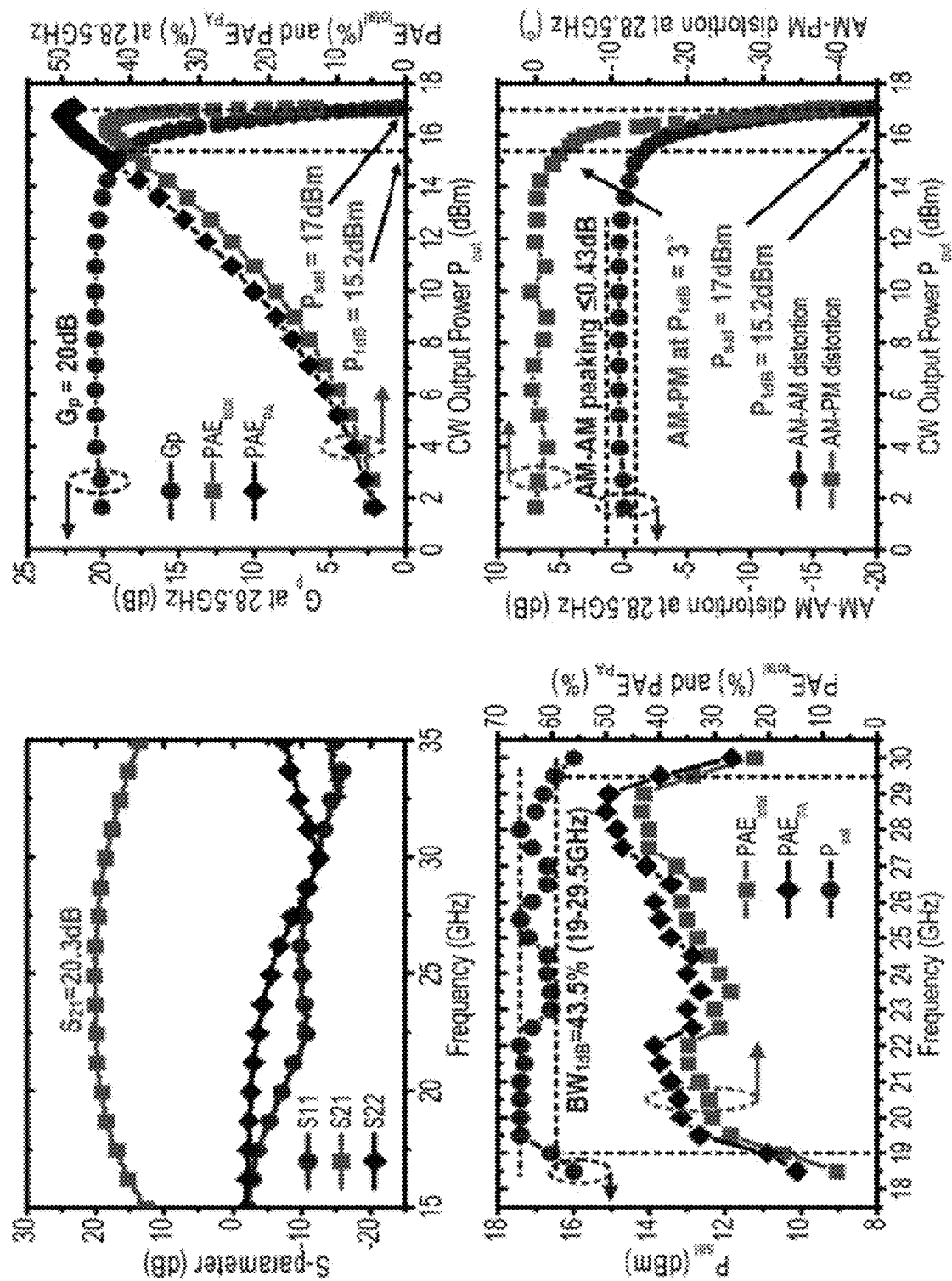
FIG. 4 shows graphs illustrating measured S-parameters and the continuous-wave large-signal performance of an example power amplifier versus output power and carrier frequency, in accordance with the disclosed technology.

A specific example of the above-discussed technology (with the specific example power amplifier output network being referred to herein as power amplifier output network 102a and the corresponding specific power amplifier being referred to herein as power amplifier 100a) may be implemented in, as a non-limiting example, a 0.13 µm SiGe BiCMOS process with a 0.91×0.32 mm² core area excluding pads, as shown in FIG. 3. Corresponding small-signal measurements and continuous-wave large-signal measurements are shown in FIG. 4. At 28.5 GHz, the example power amplifier can achieve a $P_{sat}$ of approximately 17 dBm and a $P_{1dB}$ of approximately 15.2 dBm, a power gain $G_p$ of 20 dB, a peak $PAE_{total}$ of approximately 43.5%, and a peak $PAE_{PA}$ of approximately 50%. As will be appreciated, for a fair comparison with existing, reported two-stage and one-stage power amplifiers, $PAE_{total}$ may represent the overall PAE of the two-stage power amplifier including both the driver and power amplifier output stage, while $PAE_{PA}$ may represent for the single-stage power amplifier PAE (i.e., the power amplifier output stage only). The measured $P_{sat}$ may be approximately 16.4 to approximately 17.4 dBm for approximately 19 to approximately 29.5 GHz, which may achieve an approximately 43.3% large-signal $P_{out}$ 1 dB bandwidth. FIG. 4 may also show the AM-PM distortion of only approximately 3 degrees and may show the AM-AM gain peaking within approximately 0.43 dB up to $P_{1dB}$ at approximately 28.5 GHz.

Figure 5A:
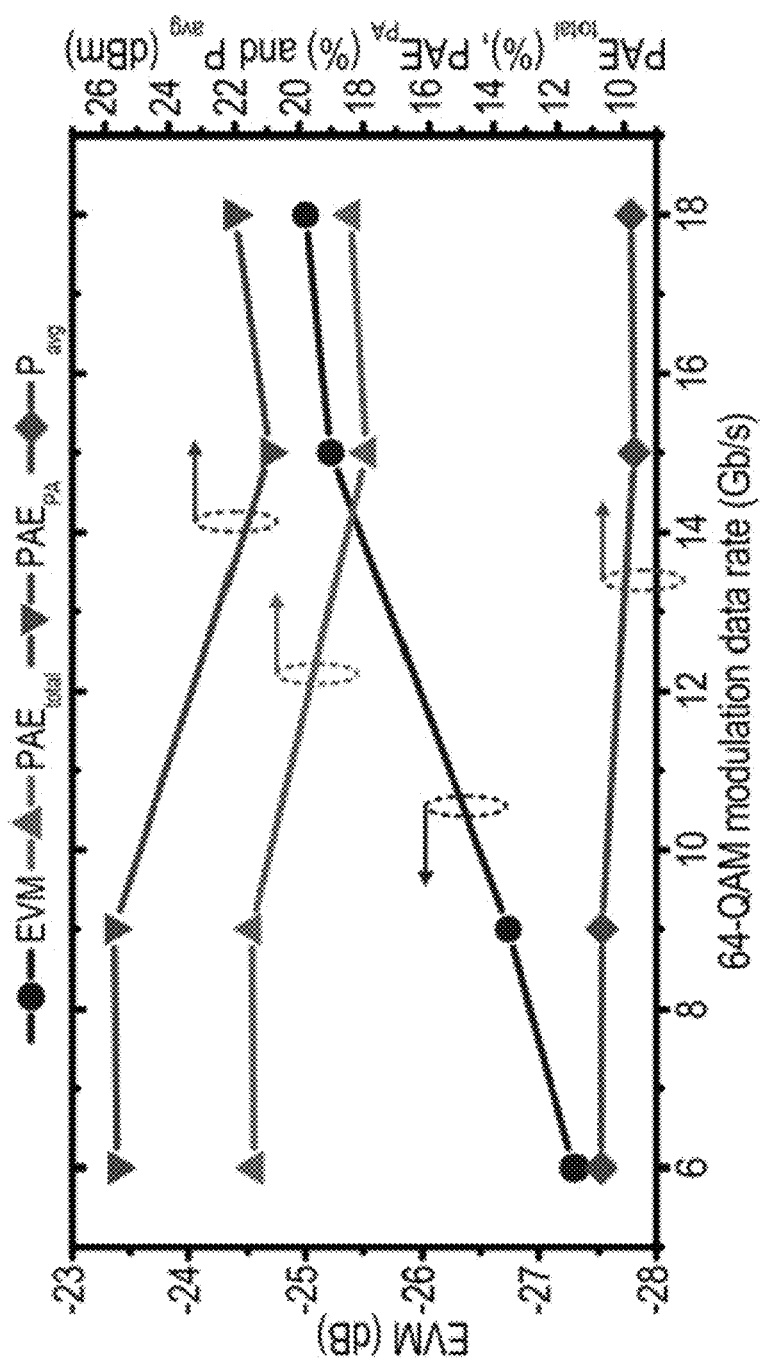
FIGS. 5A-5D illustrate 64-QAM modulation measurement results for an example power amplifier, in accordance the disclosed technology.
Figure 5B:
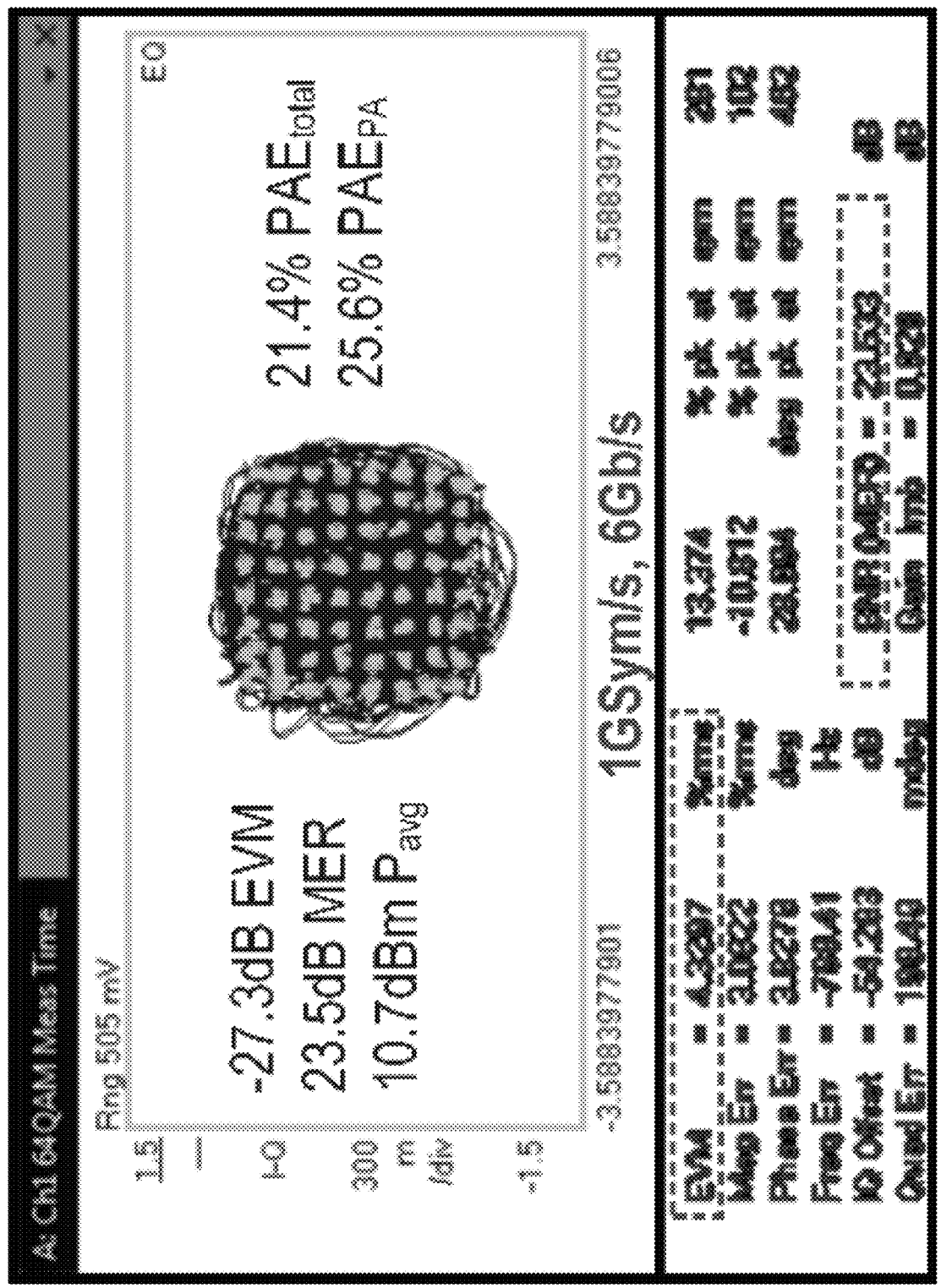
Figure 5C:
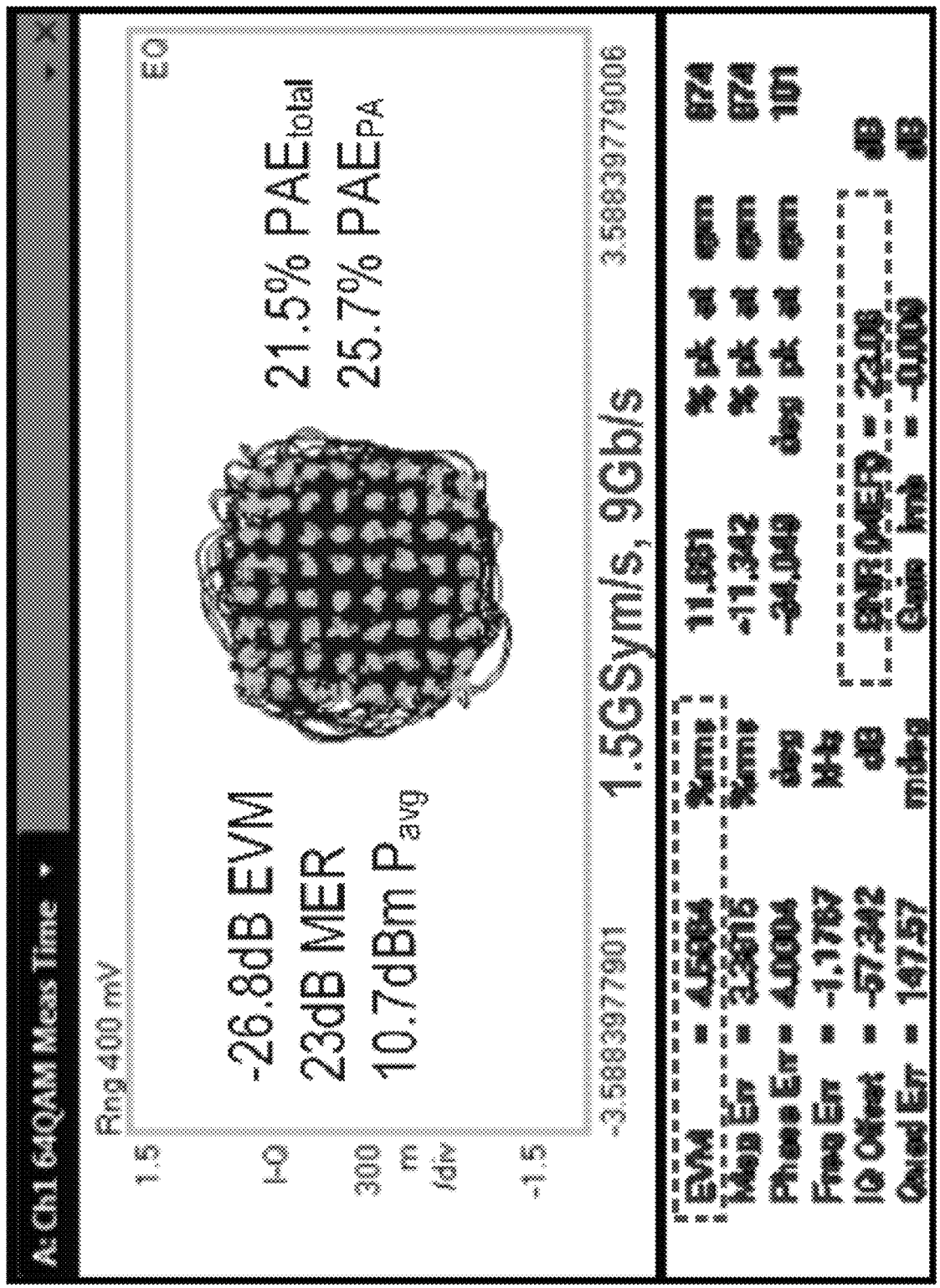
Figure 5D:
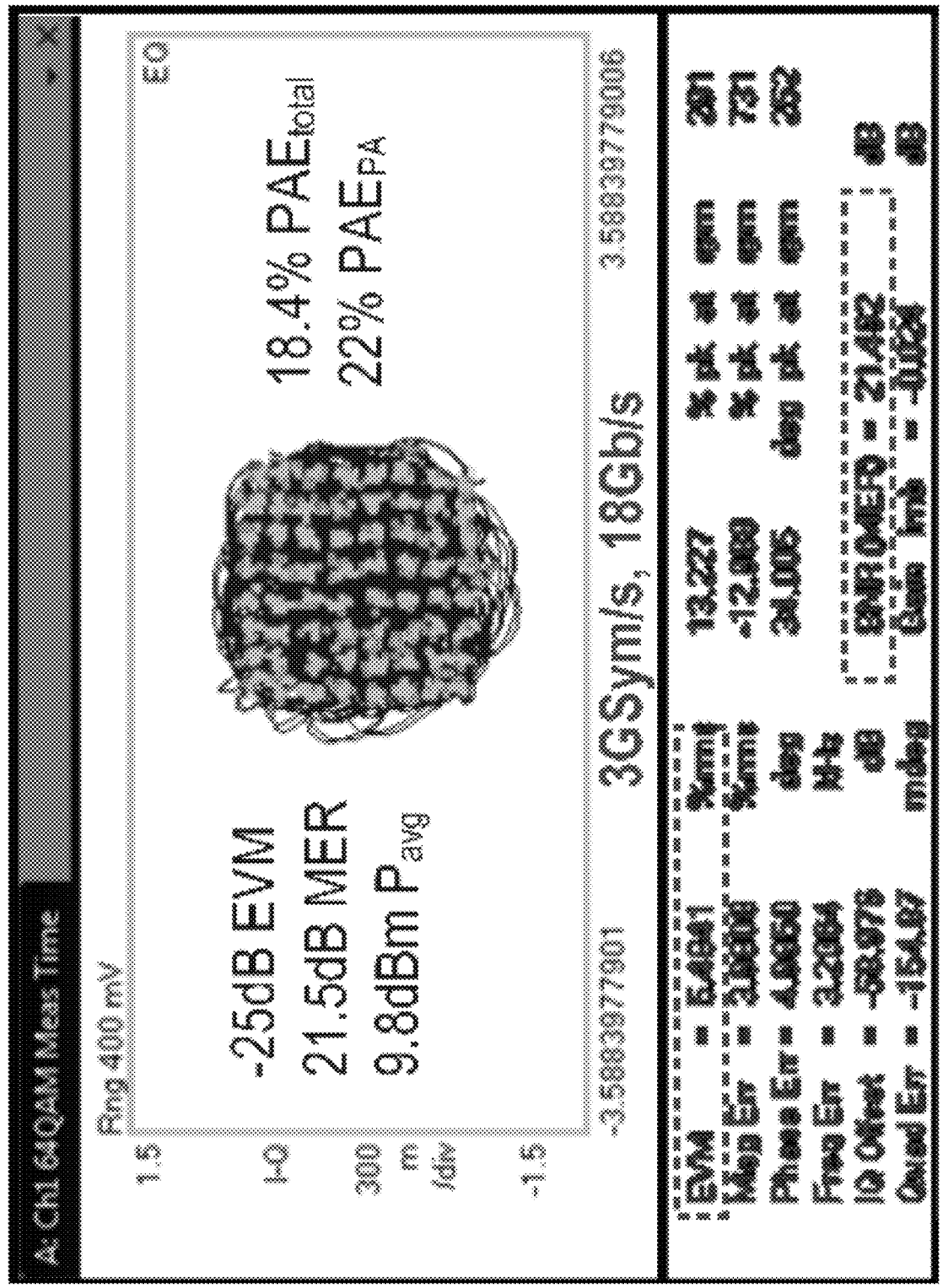
Figure 5E:
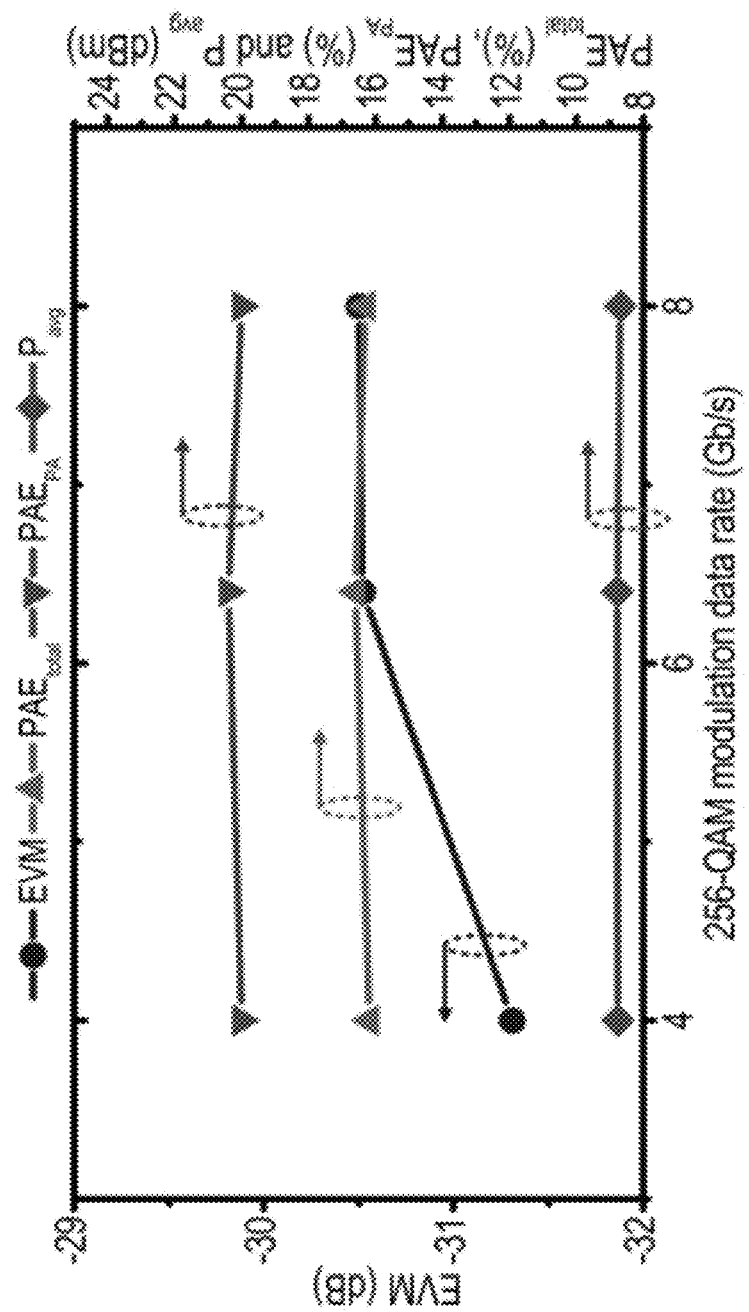
FIGS. 5E-5H illustrate 256-QAM modulation measurement results for an example power amplifier, in accordance the disclosed technology.
Figure 5F:
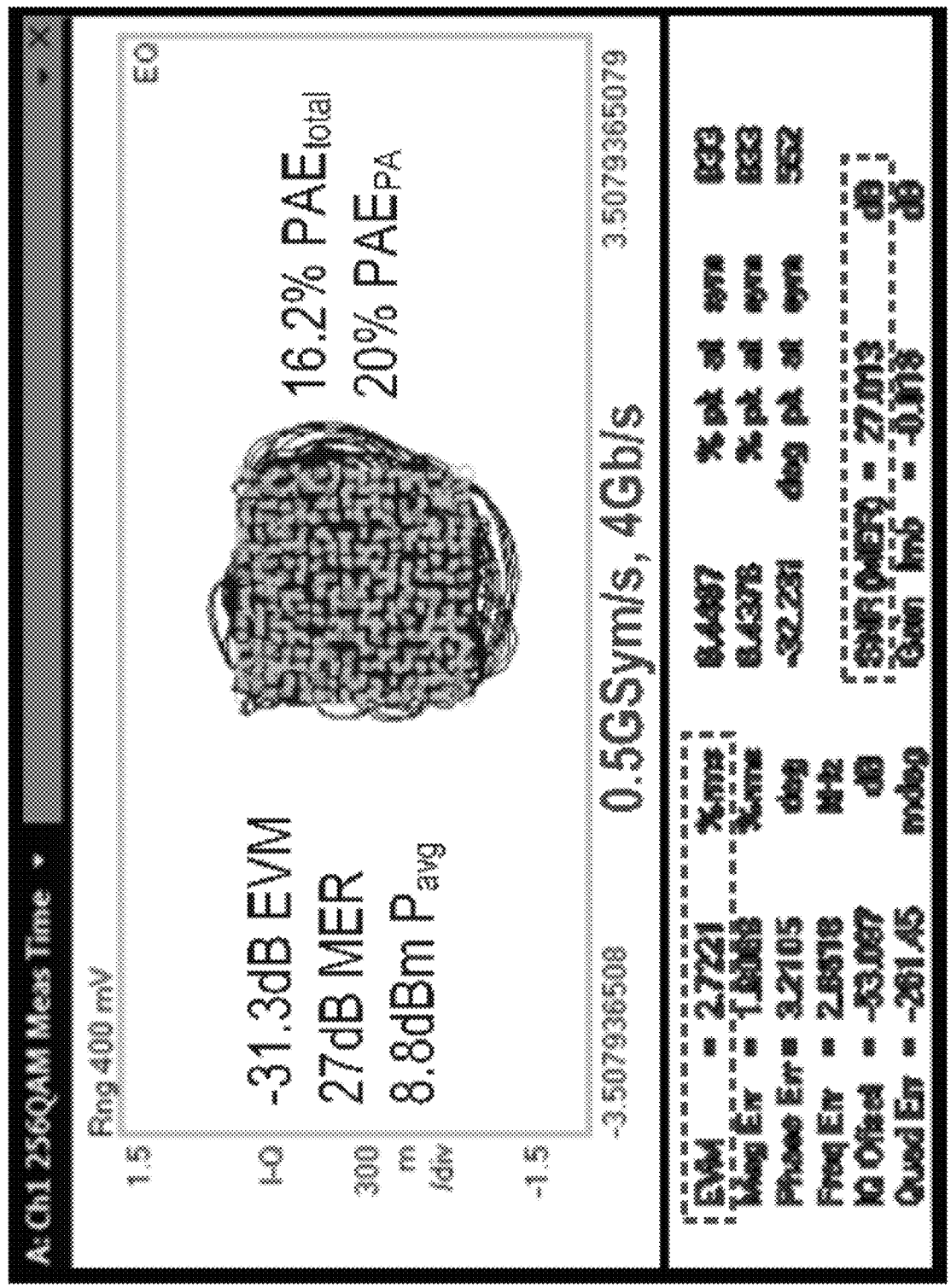
Figure 5G:
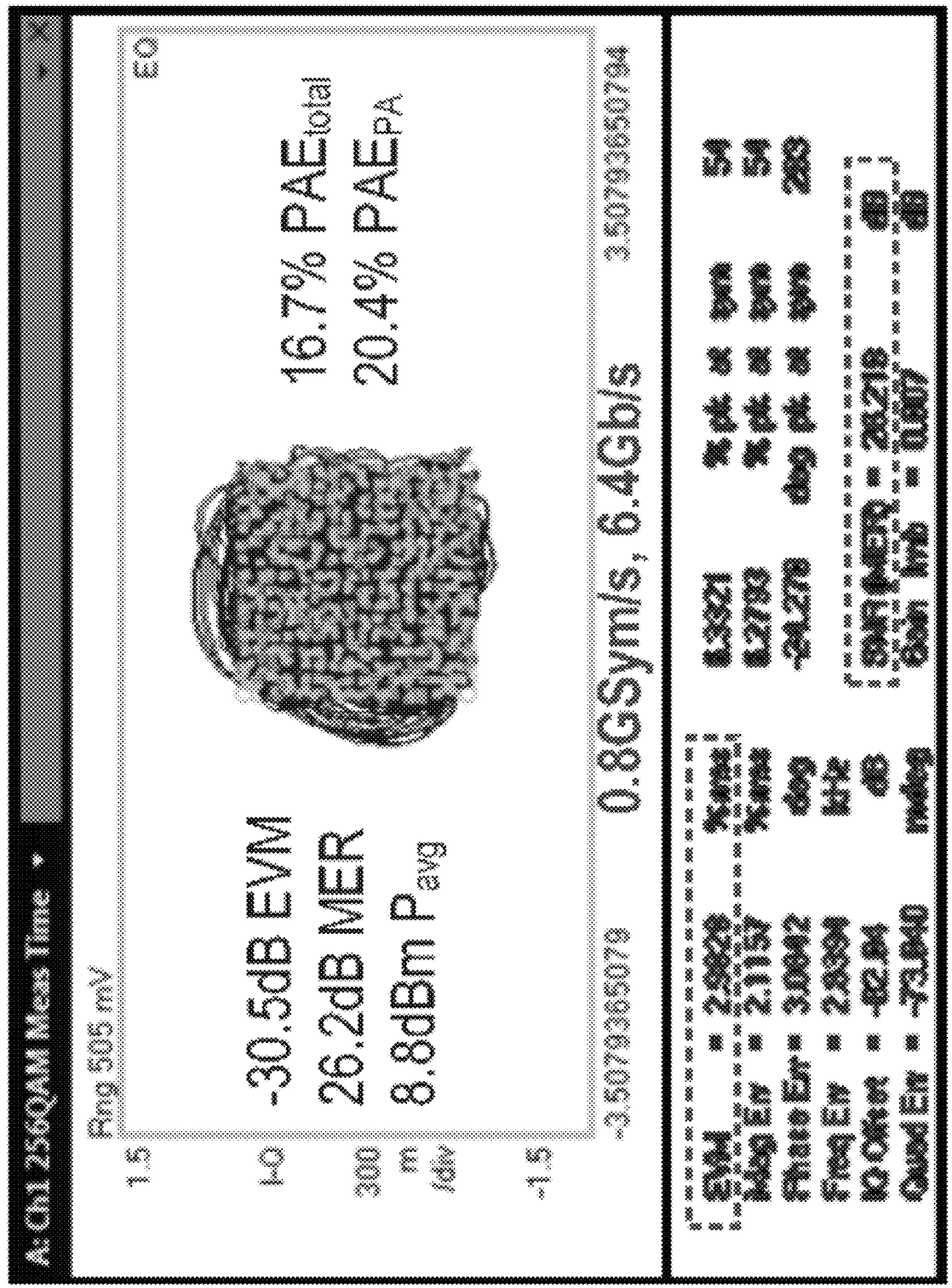
Figure 5H:
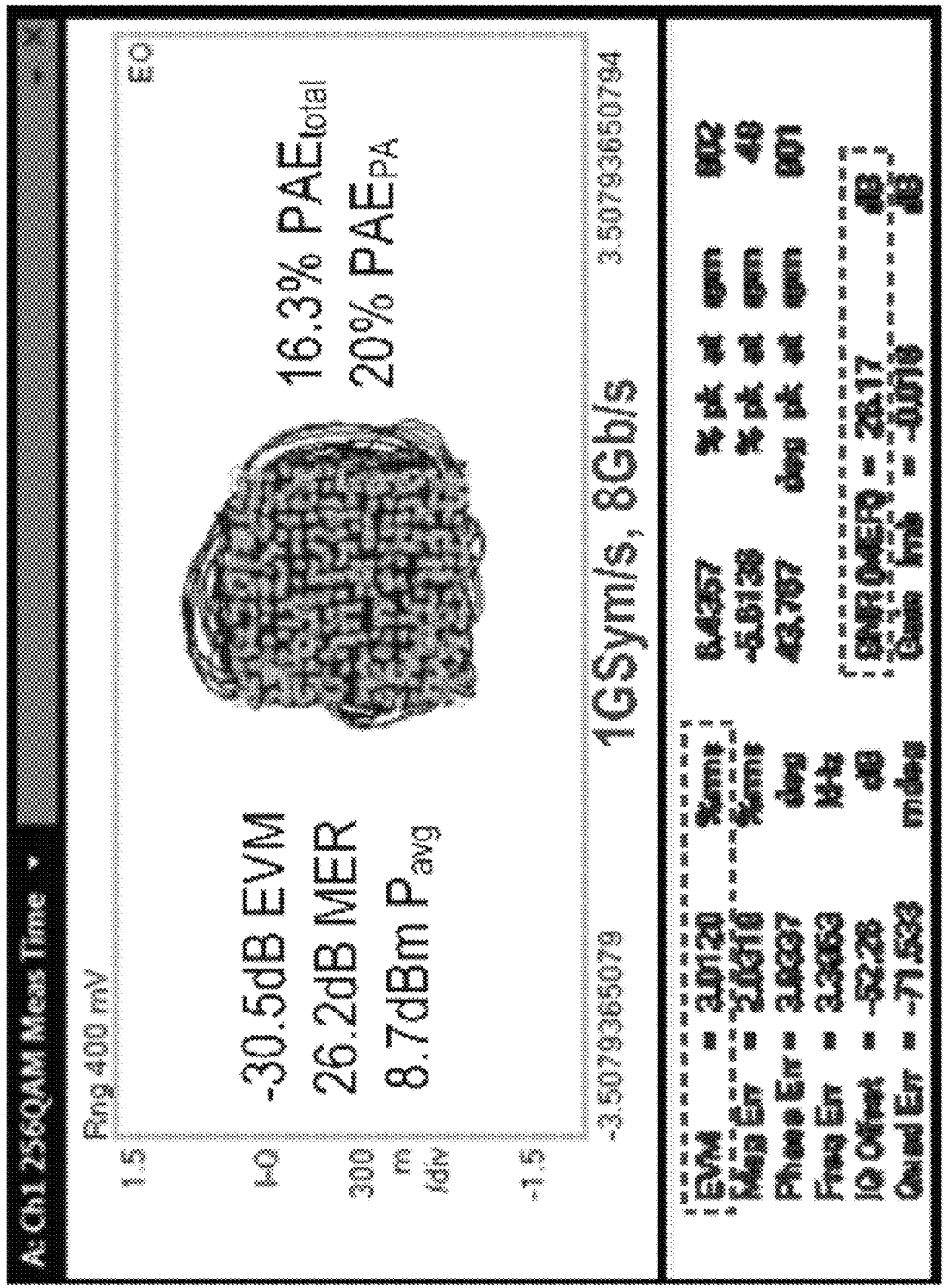

As shown in FIGS. 5A-5D, the example power amplifier 100a was first measured using 64-QAM signals at 1 GSym/s (6 Gb/s), 1.5 GSym/s (9 Gb/s), 2.5 GSym/s (15 Gb/s), and 3 GSym/s (18 Gb/s) at the carrier frequency ($f_{carrier}$) 28.5 GHz, as shown in FIG. 5A. With no digital predistortion, the measured error vector magnitude (EVM) was less than approximately −25 dB for all measured data rates. At 3 GSym/s (18 Gb/s), the EVM was approximately −25 dB with an average output power $P_{avg}$ of approximately 9.8 dBm and $PAE_{total}$ of approximately 18.4%. As shown in FIGS. 5E-5H, the example power amplifier output network 102a was measured using 256-QAM signals at 0.5 GSym/s (4 Gb/s), 0.8 GSym/s (6.4 Gb/s), and 1 GSym/s (8 Gb/s) at carrier frequency ($f_{carrier}$) 28.5 GHz. As shown, the EVM was kept below approximately −30 dB for all measured data rates, and at 1 GSym/s (8 Gb/s), the EVM was approximately −30 dB with a $P_{avg}$ of approximately 8.7 dBm and a $PAE_{total}$ of approximately 16.3%.

Referring to FIG. 6, compared with existing, reported silicon-based power amplifiers at similar frequencies, the example power amplifier 100a demonstrated the highest data rate (approximately 18 Gb/s 64-QAM and approximately 8 Gb/s 256-QAM), the highest peak PAE (a two-stage $PAE_{total}$ of approximately 43.5% and a one-stage $PAE_{PA}$ of approximately 50%), the highest modulation PAE (approximately 18.4% for 3 GSym/s 64-QAM and approximately 16.3% for 1 GSym/s 256-QAM), and the highest wide $P_{out}$ 1 dB bandwidth (approximately 43.3% at 19 GHz to 29.5 GHz). Moreover, the example power amplifier 100a, which is an example of a continuous-mode harmonically tuned output power amplifier network, occupied only one on-chip transformer footprint, providing an ultra-compact power amplifier design.

The disclosed power amplifier 100 (e.g., including example power amplifier 100a) can operate across a wide spectrum of frequencies (e.g., approximately 19 GHz to approximately 29.5 GHz) while providing a high peak PAE (e.g., in the range of approximately 43.5% to approximately 50%), a high modulation PAE (e.g., in the range of approximately 18.4% to approximately 20.4% for 3 GSym/s 64-QAM, in the range of approximately 16.3% to approximately 18.3% for 1 GSym/s 256-QAM), and a high average output power ($P_{out}$) (e.g., at least approximately 9.8 dBm for 3 GSym/s 64-QAM, at least approximately 8.7 dBm for 1 GSym/s 256-QAM). The disclosed power amplifier can provide an on-chip, continuous-mode, wideband, harmonic-termination output network simultaneously for the fundamental harmonics, second-order harmonics, and third-order harmonics, and the disclosed power amplifier can have a physical area footprint equal to only the physical area footprint of a single transformer. Further, the disclosed power amplifier may provide the benefits described herein without any tunable elements or switches. Thus, the disclosed power amplifier may provide an ultra-compact power amplifier design for broadband 5G massive MIMO networks, such as the example network shown in FIG. 7.

Continuous-mode harmonically tuned power amplifiers 100, 800 may generalize the optimum harmonic termination conditions and may substantially expand the carrier frequency range. For a continuous-mode Class-F power amplifier operation, the voltage waveform in can be expressed as $$V_{CF}(\theta) = (V_{DC} - V_{F1} \cos\theta + V_{F3} \cos 3\theta) \times (1 - \gamma \sin\theta) \quad (1)$$

The first bracket of Equation 1 may refer to the voltage waveform formulation for the conventional Class-F with $\gamma=0$, and the last bracket in Equation 1 may be a defining term $(1-\gamma \sin \theta)$ that may perform a new design space. Thus, the parameter $\gamma$ may vary between $-1$ and $1$ (i.e., $-1 \leq \gamma \leq 1$), forming a family of voltage waveforms that provide multiple solutions to maintain constant power and efficiency. As result, each value corresponding to the particular power amplifier output fundamental, second- and third-order harmonic impedances can be expressed as $$Z_{CF,1} = R_{opt}\frac{2}{\sqrt{3}} + j\gamma R_{opt}, \qquad (2)$$

$$Z_{CF,2} = jR_{opt}\frac{7\sqrt{3}\pi}{24}\gamma, Z_{CF,3} = \infty$$

where $R_{opt}$ is the optimum impedance of the standard Class-B operation with all harmonics short-circuited.

On other hand, for a continuous-mode Class-$F^{-1}$ power amplifier operation, the current waveform can be expressed as $$i_{CIF}(\theta) = (I_{DC} - i_{IF,1} \cos \theta + i_{IF,3} \cos 3\theta) \times (1 - \xi \sin \theta) \qquad (3)$$

The first bracket of Equation 3 may be the conventional voltage waveform formulation for the conventional Class-$F^{-1}$ operation with $\xi=0$. The last bracket of Equation 3 may also be a defining term $(1-\xi \sin \theta)$, which may offer a new design space. The parameter may vary between $-1$ and $1$ (i.e., $-1 \leq \xi \leq 1$), forming a family of current waveforms that provide multiple solutions to maintain constant delivery power and efficiency. Each value corresponding to the continuous-mode power amplifier output fundamental, 2nd-order and 3rd-order harmonic impedances can be expressed as the following $$Y_{CIF,1} = G_{opt}\sqrt{2}i_{IF,1} + jG_{opt}\sqrt{2}i_{DC}\xi,$$

$$Y_{CIF,2} = jG_{opt}2(i_{IF,1} + i_{IF,2})\xi, Y_{CIF,2} = \infty \qquad (4)$$

where $G_{opt}$ ($=1/R_{opt}$) is the optimum admittance. These continuous-mode power amplifier operations can be realized over the desired operation bandwidth by applying the required harmonic impedances for the different $\gamma$ or $\xi$ values. Additionally, these continuous-mode power amplifiers can deliver output power and efficiency almost equivalent to that of the conventional power amplifiers. The power amplifier load impedance (e.g., $Z_L$) behaviors for different power amplifier operations is summarized in a table shown in FIG. 10. From this table, it can be seen that a continuous-mode power amplifier operation (i.e., $\gamma \neq 0$ and $\xi \neq 0$.) may cause fundamental impedance (e.g., capacitive/inductive or inductive/capacitive) and second-harmonic reactance (e.g., inductive/capacitive or capacitive/inductive) out of phase. The third-harmonic impedances may stay either high or low.

Figure 7A:
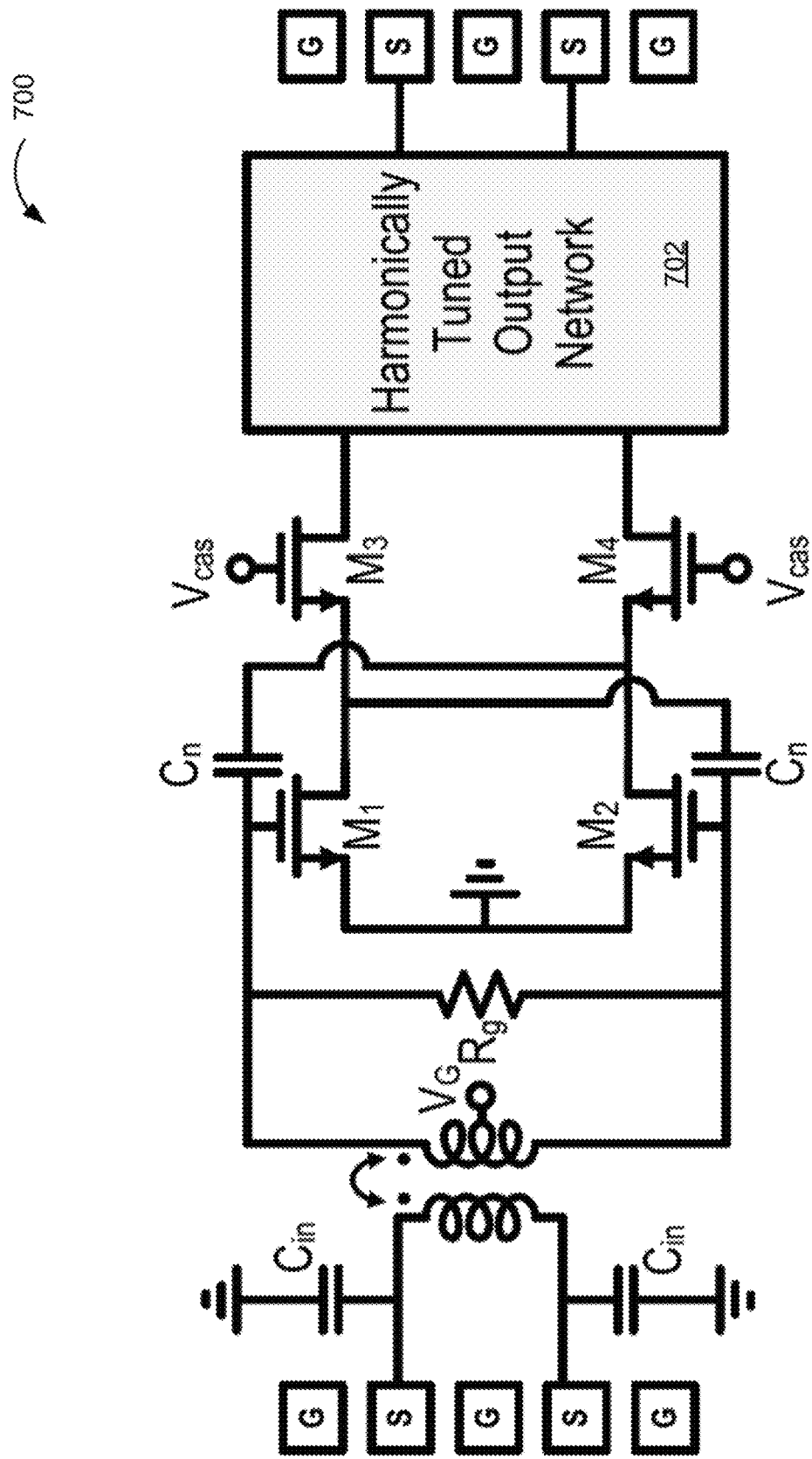
FIG. 7A is a schematic of an example power amplifier, in accordance with the disclosed technology.
Figure 7C:
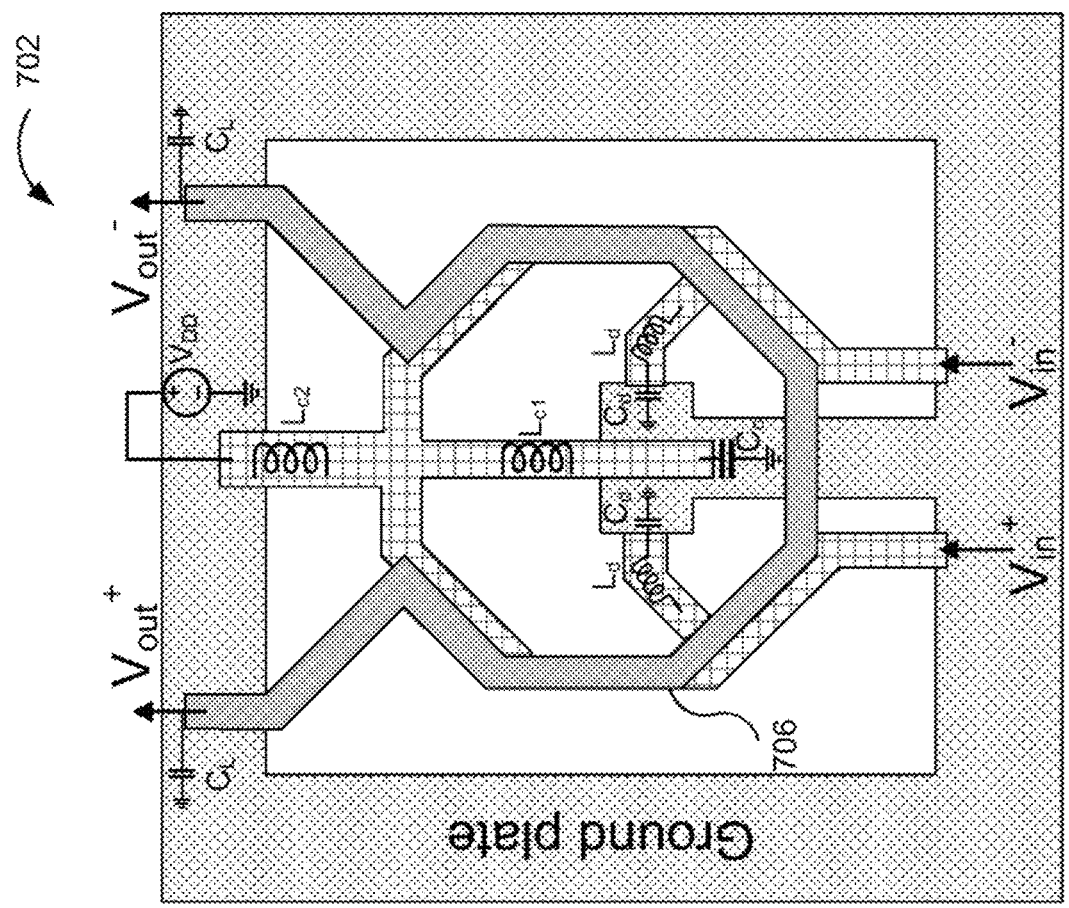
FIG. 7C is an EM model of an example power amplifier output network, in accordance with the disclosed technology.
Figure 7B:
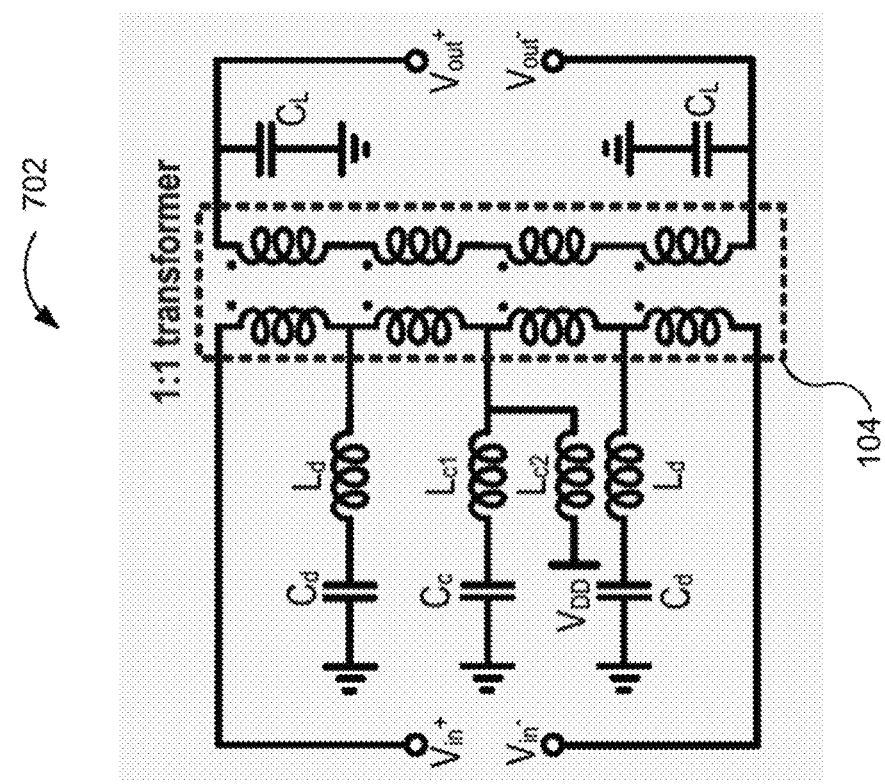
FIG. 7B is a simplified schematic of a n example power amplifier output network, in accordance with the disclosed technology.

Referring to FIGS. 7A-7B, the disclosed technology may include a continuous-mode, hybrid Class-F and inverse Class-F (i.e., Class-F/$F^{-1}$) power amplifier 700, which may achieve high PAE and instantaneous or near instantaneous broadband operation to span multiple mm-wave 5G bands (e.g., 28 GHz, 37 GHz, and 39 GHz). The power amplifier 700 may be configured to provide such benefits without the use any tunable elements or switches, which may result in an ultracompact chip size and simple implementation.

FIG. 7A shows a schematic of an example single-stage differential continuous-mode hybrid Class-F/$F^{-1}$ power amplifier 700. The power amplifier 700 may be is realized using a cascode topology having identical sizes for M1, M2, M3, and M4. For example, M1, M2, M3, and M4 may each have a width of 180 μm and a length of 40 nm. M1, M2, M3, and M4 may be biased at, for example, $V_G=0.3V$, $V_{cas}=1.3V$, and $V_{DD}=2V$. The power amplifier 700 may include one or more neutralization capacitors $C_n$, which may to improve power gain, reverse isolation, and/or stability. The input matching network may include a 1:1 transformer 704 with parallel capacitors $C_{in}$ and a parallel resistor $R_g$. As an example, the one or more one or more neutralization capacitors $C_n$ may each have a capacitance of approximately 55 fF, the parallel capacitors $C_{in}$ may each have a capacitance of approximately 160 fF, and the parallel resistor $R_g$ may have a resistance of approximately 170Ω. Both transformers of the input and output matching network may utilize the top two metal layers of the power amplifier output network 102. As an example, the top two layers may include aluminum (e.g., approximately 4.1 μm of aluminum) and copper (e.g., 3.9 μm of copper). The top layer may be aluminum, a layer of copper may be disposed immediately beneath the layer of aluminum. The power amplifier output network 102 may include, as a non-limiting example, eight layers.

Existing continuous-mode power amplifier designs may require multiple inductors and capacitors to realize second-order and/or third-order harmonic impedance terminations and tuning, which may substantially increase passive loss, design complexity, and chip size. To overcome these issues, the continuous-mode harmonically-tuned output network 702, which only occupies an ultra-compact single transformer foot-print without additional tunable components or switches, as shown in FIG. 7C, which may render the power amplifier 700 particularly suitable for multi-band 5G massive MIMOs. The power amplifier output network 702 may exploit and enhance the parasitic elements in a physical on-chip transformer, which may achieve continuous-mode harmonic tuning in both differential-mode and common-mode while also providing substantial network simplification and physical, area-reduction. The power amplifier output network 702 may include a single 1:1 transformer 704, three harmonic tuning capacitors $C_d$, $C_c$, and two matching capacitors CL to realize hybrid Class-F and Class-$F^{-1}$ operations at the lower and higher frequency bands, respectively. As will be appreciated, $\omega_L$ and $\omega_H$ may represent the lowest and highest power amplifier 700 fundamental frequencies, respectively. The power amplifier output network 702 may include two symmetrically embedded inductor branches $L_d$ inside the transformer 704, which may provide third-order harmonic impedance tuning in differential-mode, and two extended inductor branches $L_{c1}$ and $L_{c2}$, which may provide second-order harmonic impedance tuning in common-mode. One or both of the extended inductor branches $L_{c1}$ and $L_{c2}$ may have a physical length in the range of approximately 40 μm to approximately 120 μm. The two matching capacitors CL can facilitate a fundamental operation bandwidth extension, and the longer extended branches $L_{c1}$ can provide a larger inductance for second-order harmonic impedance.

Referring to FIGS. 8A-8H, the power amplifier output harmonic termination network 702 can be explained. Here, $L_{dm1}/L_{cm1}$ and $L_{dm2}/L_{cm2}$ may represent the differential-mode and common-mode half-circuit inductances of the transformer 704, and the output leads of the transformer 704 may be absorbed into the secondary coil 706. The transformer center-tap may be a virtual ground such that $L_{c1}$, $L_{c2}$ and $C_c$ do not affect the differential-mode. $C_d$-$L_d$-$L_{dm2}$ may form a multi-resonance tank $Z_1$, as shown in FIG. 8A. In the common-mode half-circuit, the network of $C_c/2$, $2L_{c1}$, and $2L_{c2}$ may form a multi-resonance tank $Z_2$, as shown in FIG. 8B.

At fundamental frequencies (e.g., $\omega_L \leq \omega \leq \omega_H$), the series network Ca—La may behave as a small capacitor (see FIG. 8C), such that the high impedance branch can be ignored. Thus, $Z_{L,diff}$ can be converted to a simplified model, such as the one shown in FIG. 8D. In FIG. 8D, $L_m$ and $L_k$ may be the magnetization and leakage inductances, respectively, of the transformer 7040 in the half-circuit differential-mode. The equivalent inductance $L_p$ may be roughly equal to $L_{dm1}$ and $L_{dm2}$. Thus, FIG. 8D may represent a four-reactance matching network with the power amplifier output capacitance $C_O$ and may provide a predetermined or desired fundamental load impedance (e.g., $\omega_L \leq \omega \leq \omega_H$) to the power amplifier.

At the third-order harmonic of the higher band (i.e., $\omega=3\omega_H$), the series network Ca—La impedance may be slightly below its series resonance, which may short out $L_{dm2}$ and may form a series resonance of $C_d$-$L_d$-$L_{m1}$-$L_{k1}$ to produce a low load impedance, such as is shown in FIG. 8E. In this case, $L_{m1}$ and $L_{k1}$ may represent the magnetization and leakage inductances of coil $L_{dm1}$ of the transformer 704 in the half-circuit differential-mode. In addition, at the third-harmonic of the lower band (i.e., $\omega=3\omega_L$, $Z_{L,diff}$ may experience a high impedance by $L_{dm1}$ and $Z_1$ in parallel with $C_{out}$.

At the second-order harmonic of the higher band (i.e., $\omega=2\omega_H$, $Z_2$ may provide a high impedance, while the remaining $C_d$-$L_d$ series tank may behave as a capacitor, such as is shown in FIG. 8G. Therefore, with proper tuning, the second-order harmonic impedance $Z_{L,com}$ may be dominated by $C_{out}$, $L_{cm1}$, and the effective capacitance due to series $C_d$-$L_d$, which may achieve the predetermined or desired continuous-mode second-order harmonic impedance. Additionally, at the second-order harmonic of the lower band (i.e., $\omega=2\omega_L$), $Z_2$ may become inductive while the series network $C_d$-$L_d$ may remain capacitive. Therefore, $Z_{L,com}$ may present a low overall impedance with proper tuning.

Figure 9:
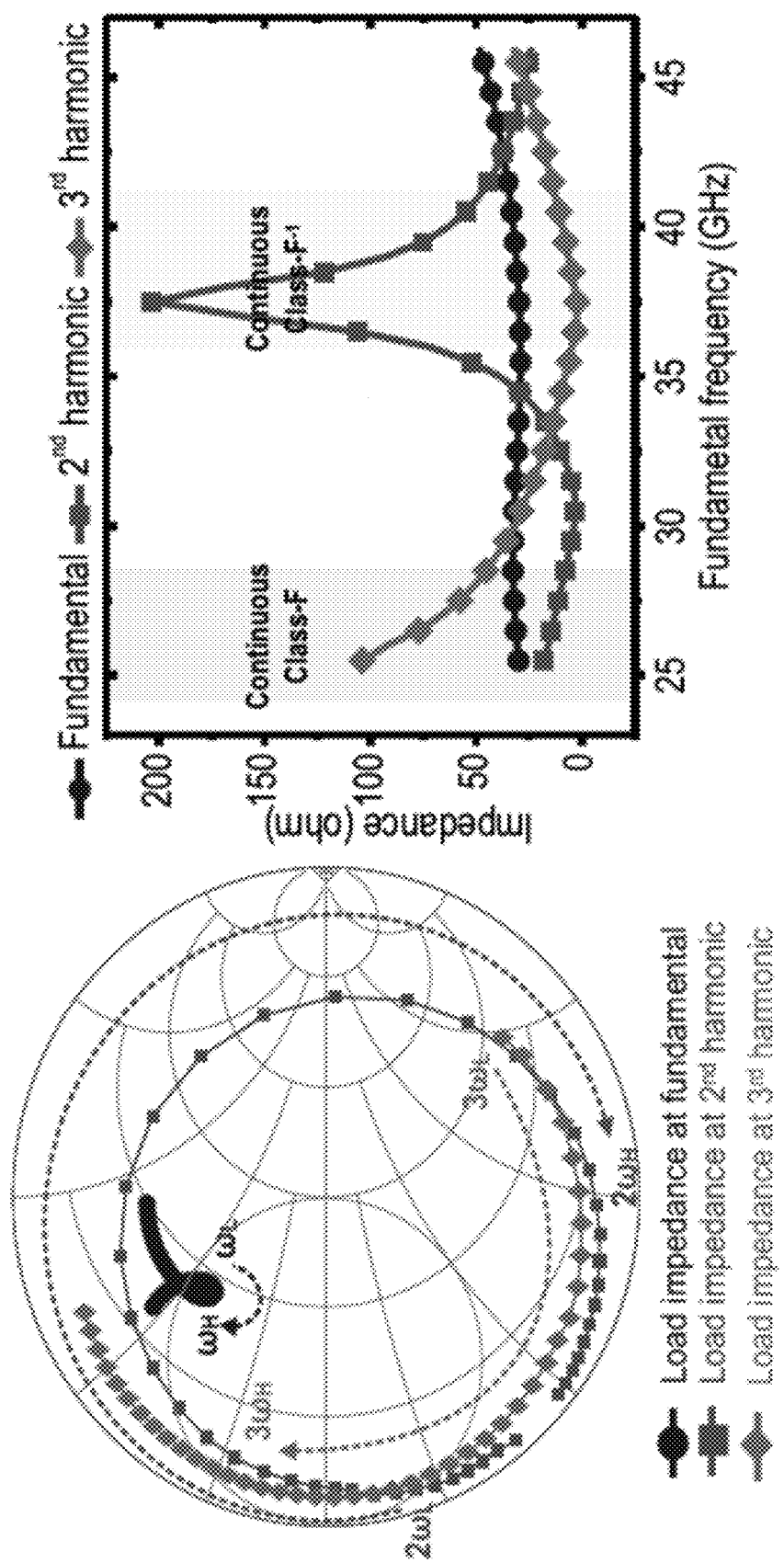
FIG. 9 illustrates a Smith chart showing trajectories of half-circuit load impedance at fundamental harmonics, second-order harmonics, and third order harmonics for an example power amplifier and an impedance response for the example power amplifier, in accordance with the disclosed technology.

The trajectories of the half-circuit load impedance at fundamental harmonics, second-order harmonics, and third-order harmonics with the absorbed power amplifier output capacitance $C_{out}$ are shown on the Smith chart in FIG. 9 with respect to an example power amplifier 700. The fundamental load impedance ($\omega_L \leq \omega \leq \omega_H$) may be inductive, while the second-order harmonic load impedances ($\omega=2\omega_L$ or $\omega=2\omega_H$) may be capacitive and may provide $-1 \leq \gamma < 0$ for continuous class-F and $-1 \leq \xi < 0$ for continuous Class-F$^{-1}$. Moreover, compared with the fundamental load impedance, the third-order harmonic load impedance may be low for the lower band ($\omega=3\omega_L$) while it is high for the higher band ($\omega=3\omega H$). Thus, the load impedance trajectories may demonstrate a continuous-mode hybrid Class-F/F$^{-1}$ operation. Further, the impedance of each harmonic for the example power amplifier 700 is shown in FIG. 9, and the continuous-mode operations for each harmonic of the example power amplifier 700 are shown in FIG. 10.

Figure 12:
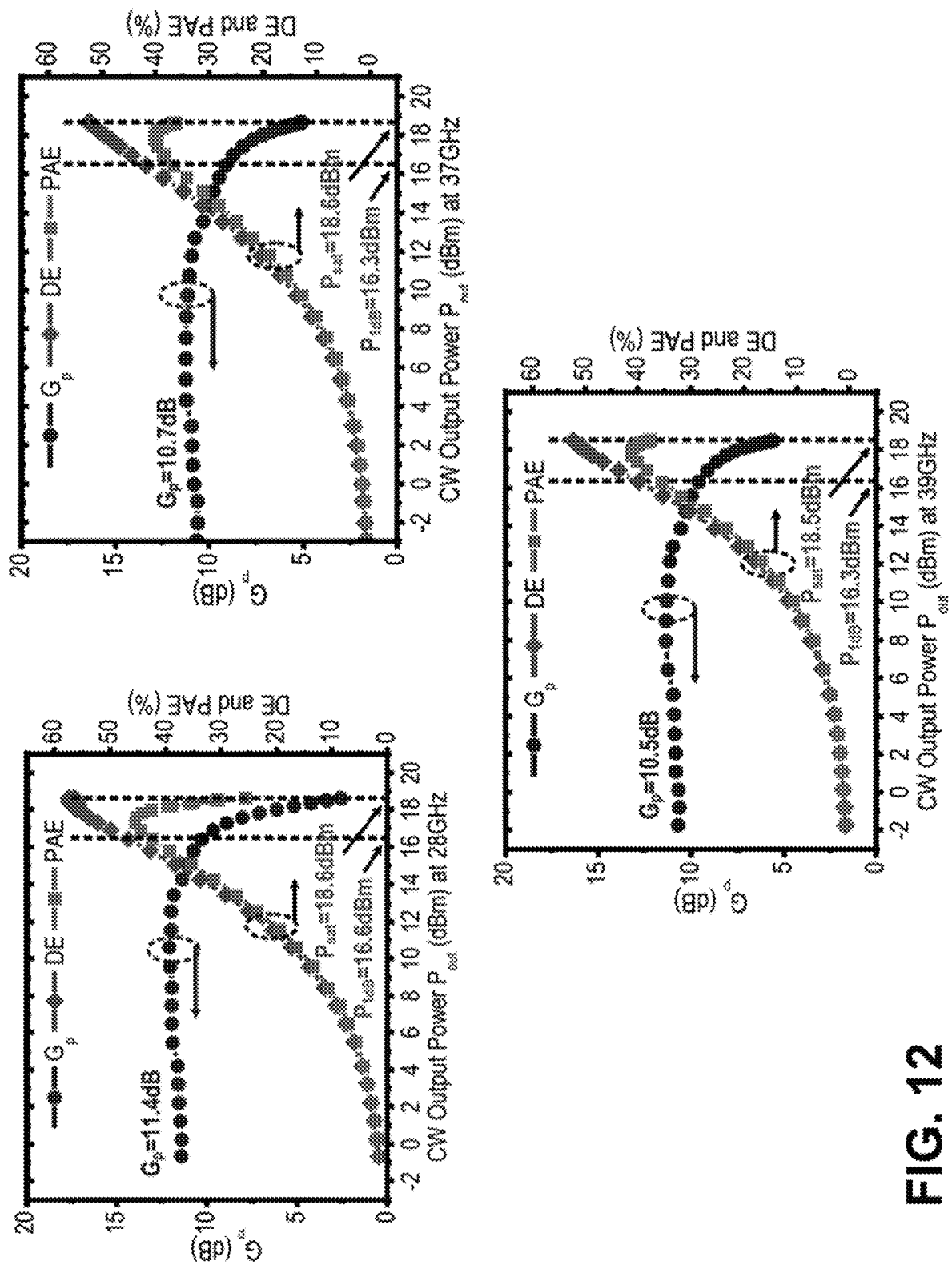
FIG. 12 depicts graphs indicating continuous-wave large-signal performances of an example power amplifier verses output power at 28 GHz, 37 GHz, and 39 GHz, in accordance with the disclosed technology.

A specific example of the above-discussed technology (with the specific example power amplifier output network being referred to herein as power amplifier output network 802a and the corresponding example power amplifier being referred to herein as power amplifier 800a) may be implemented in, as a non-limiting example, a standard 45 nm CMOS SOI process with a 0.55×0.25 mm$^2$ core area as shown in FIG. 11. FIG. 12 may illustrate measured continuous-wave large-signal performance of the example power amplifier 800a at 28 GHz, 37 GHZ, and 39 GHz, respectively. At 28 GHz, the example power amplifier 800a may achieve approximately 18.6 dBm saturated power $P_{sat}$, approximately 45.7% peak PAE, and approximately 11.4 dB power gain $G_p$. At 37 GHz, the example power amplifier 800a may demonstrate approximately 18.6 dBm $P_{sat}$, approximately 40.2% peak PAE, and approximately 10.7 dB Gp. At 39 GHz, the PA achieves 18.5 dBm Psat, 41.2% peak PAE, and 10.5 dB $G_p$. The measured PAE may include the power amplifier stage and any loss of the output network. The example power amplifier 800a may achieve a very high efficiency (e.g., a peak PAE in the range of approximately 40% to approximately 50%) and may delivers nearly constant $P_{sat}$ (e.g., a $P_{sat}$ variation within approximately 0.1 dB) at all potential mm-wave 5G bands. Additional performance measurements corresponding to the example power amplifier incorporating the example power amplifier output network 802a are indicated below:

| Frequency (GHz) | Saturated Power Output (dBm) | Power-Added Efficiency (%) |
|---|---|---|
| 18.5 | 16 | 7.4 |
| 19 | 16.6 | 17.3 |
| 19.5 | 17.4 | 27 |
| 20 | 17.4 | 30.3 |
| 20.5 | 17.4 | 31 |
| 21 | 17.4 | 32.6 |
| 21.5 | 17.3 | 34.7 |
| 22 | 17.4 | 34.7 |
| 22.5 | 17.1 | 29 |
| 23 | 16.6 | 30 |
| 23.5 | 16.6 | 27 |
| 24 | 16.7 | 29 |
| 24.5 | 16.7 | 31 |
| 25 | 17.2 | 33 |
| 25.5 | 17.4 | 35 |
| 26 | 17.1 | 36 |
| 26.5 | 16.7 | 33 |
| 27 | 16.7 | 37 |
| 27.5 | 17.1 | 42 |
| 28 | 17.4 | 42 |
| 28.5 | 17 | 43.5 |
| 29 | 16.8 | 43 |
| 29.5 | 16.5 | 34 |
| 30 | 16 | 22.5 |

FIG. 13A depicts measured continuous-wave large-signal performance of the example power amplifier 800a versus frequency. The $P_{sat}$ output power 1 dB bandwidth $BW_{1dB}$ was approximately 54.3% from 23.5 GHz to 41 GHz. The peak PAE was approximately 46% at approximately 29 GHz. Also, the example power amplifier 800a maintained over approximately 30% PAE from approximately 25.5 GHz to approximately 41 GHz (BW was approximately 46.6%), which addresses the efficiency-bandwidth challenge of mm-wave power amplifiers. Further, FIG. 13B demonstrates that the Class-F mode may operate at approximately 28 GHz, while Class-F$^{-1}$ mode may operate at approximately 38 GHz. A mode transition may be shown at 35 GHz. FIG. 13B depicts measured small-signal S-parameters of the example power amplifier 800a versus frequency. FIG. 13B shows that the small-signal 3 dB bandwidth $BW_{3dB}$ was approximately 51% from 25.9 GHz to 43.7 GHz. The example power amplifier 800a exhibited good input matching, achieving return loss $R_L$ below approximately 10 dB from approximately 27.3 to approximately 43 GHz. The peak $S_{21}$ was approximately 12.3 dB at approximately 31 GHz. Referring to FIG. 14, measured performance metrics of the example power amplifier 800a is compared with performance characteristics of existing, silicon-based power amplifiers at various frequencies.

Figure 15B:
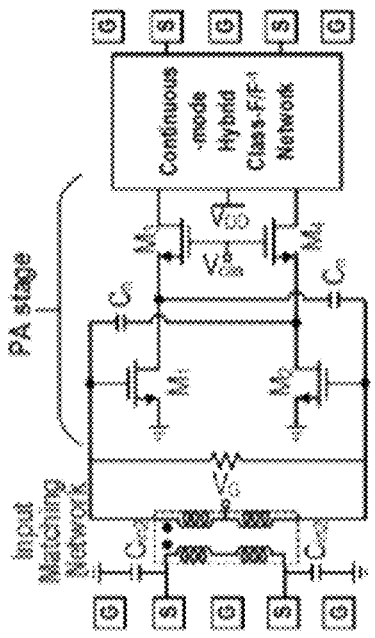
FIG. 15B is a schematic diagram of a one-stage continuous-mode hybrid Class-F/Class-$F^{-1}$ power amplifier, in accordance with the disclosed technology.
Figure 15A:
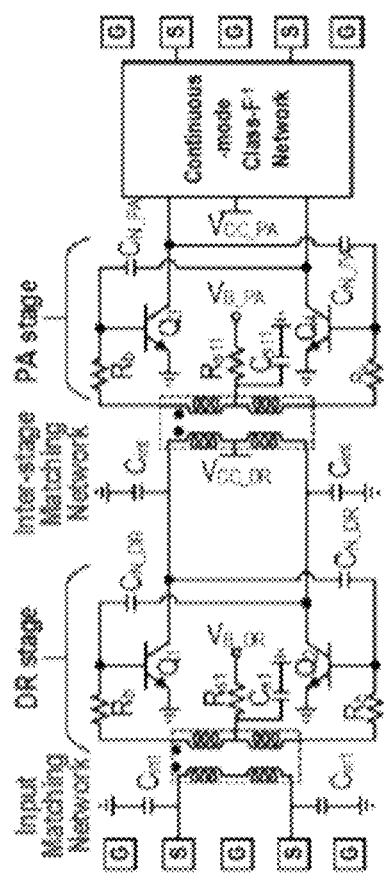
FIG. 15A is a schematic diagram of a two-stage continuous-mode Class-F' power amplifier, in accordance with the disclosed technology.
Figure 15C:
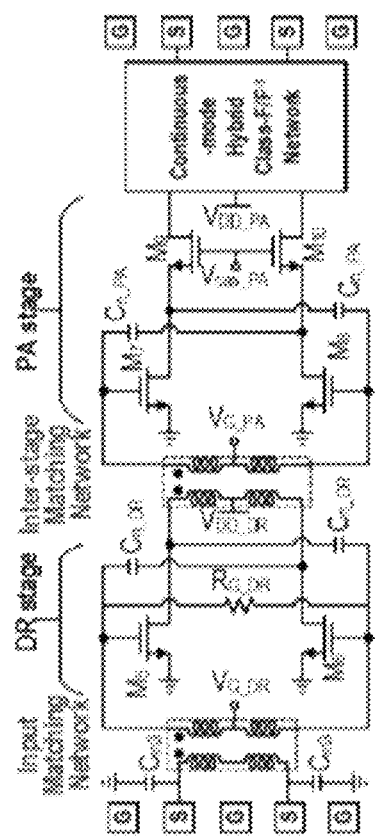
FIG. 15C is a schematic diagram of a two-stage continuous-mode hybrid Class-F/Class-$F^{-1}$ power amplifier, in accordance with the disclosed technology.

As shown in FIGS. 15A-15C, the disclosed power amplifier output networks 102, 802 may be incorporated into various amplifiers, as appropriate. For example, power amplifier output network 102 may be incorporated into a two-stage continuous-mode Class-$F^{-1}$ power amplifier (e.g. power amplifier 100). As another example, power amplifier output network 802 may be incorporated into a one-stage continuous-mode hybrid Class-F/Class-$F^{-1}$ power amplifier (e.g. power amplifier 800) or a two-stage continuous-mode hybrid Class-F/Class-$F^{-1}$ power amplifier (e.g. power amplifier 800).

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. For example, certain attributes and features discussed herein with respect to power amplifier output network 102 may be equally attributable to power amplifier output network 702 (and vice versa) unless expressly provided otherwise. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention be defined by the claims appended hereto.

What is claimed is:

1. A power amplifier configured to operate in both a common mode and a differential mode comprising:
   a transformer;
   a common tuning branch configured to provide second-order harmonic tuning in the common mode; and
   a differential tuning branch configured to provide third-order harmonic tuning in the differential mode;
   wherein the power amplifier is configured to operate at an operating frequency greater than or equal to 18.5 GHz.

2. The power amplifier of claim 1 further comprising:
   an input; and
   an output;
   wherein the transformer comprises:
      a primary inductor coil coupled to the input; and
      a secondary inductor coil coupled to the output.

3. The power amplifier of claim 1, wherein the common tuning branch comprises two inductor branches coupled to the transformer and configured to provide second-order harmonic impedance tuning in the common mode; and
the differential tuning branch comprises harmonic tuning capacitors coupled to the transformer and configured to provide third-order harmonic impedance tuning in the differential mode.

4. The power amplifier of claim 2, wherein the primary inductor coil is symmetrically positioned within the transformer with respect to the secondary inductor coil; and
   wherein the differential tuning branch comprises the primary and secondary inductor coils of the transformer.

5. The power amplifier of claim 4, wherein the power amplifier has a footprint area of less than or equal to approximately 0.14 $mm^2$.

6. The power amplifier of claim 4, wherein the power amplifier is configured to operate in both the common mode and the differential mode simultaneously.

7. The power amplifier of claim 4, wherein the power amplifier has a hybrid Class F/Class $F^{-1}$ topology.

8. The power amplifier of claim 4, wherein the power amplifier has a fractional bandwidth of approximately 54.3%.

9. The power amplifier of claim 4, wherein the power amplifier is further configured to have a peak power-added efficiency between approximately 33% and approximately 50% when the operating frequency is between approximately 28 GHz and approximately 45 GHz.

10. The power amplifier of claim 4, wherein the power amplifier is further configured, when the operating frequency is approximately 28 GHz, to have:
    a saturated power output of between approximately 18.6 dBm and approximately 28 dBm;
    a peak power-added efficiency of between approximately 30% and approximately 46%; and
    a power gain between approximately 10 dB and approximately 25 dB.

11. The power amplifier of claim 4, wherein the power amplifier is further configured, when the operating frequency is approximately 37 GHz, to have:
    a saturated power output of between approximately 18.6 dBm and approximately 26 dBm;
    a peak power-added efficiency of between approximately 25% and approximately 42%; and
    a power gain of between approximately 10 dB and approximately 25 dB.

12. The power amplifier of claim 4, wherein the power amplifier is further configured, when the operating frequency is approximately 39 GHz, to have:
    a saturated power output of between approximately 18.5 dBm and approximately 26 dBm;
    a peak power-added efficiency of between approximately 25% and approximately 42%; and
    a power gain of between approximately 10 dB and approximately 25%.

13. The power amplifier of claim 1, wherein:
    the transformer is a single 1:1 transformer comprising two symmetrically embedded inductor branches;
    the common tuning branch comprises two extended inductor branches coupled to the transformer and configured to provide second-order harmonic impedance tuning in the common mode;
    the differential tuning branch comprises three harmonic tuning capacitors coupled to the transformer and configured to provide third-order harmonic impedance tuning in the differential mode; and
    the power amplifier is further configured to:
       simultaneously provide continuous-mode harmonic tuning at both the differential mode and the common mode; and operate at an operating frequency greater than or equal to 20 GHz.

14. A power amplifier configured to simultaneously provide continuous-mode harmonic tuning at both a differential mode and a common mode, the power amplifier comprising:
- a single 1:1 transformer including two symmetrically embedded inductor branches;
- three harmonic tuning capacitors coupled to the transformer and configured to provide third-order harmonic impedance tuning in the differential mode; and
- two extended inductor branches coupled to the transformer and configured to provide second-order harmonic impedance tuning in the common mode.

15. The power amplifier of claim 14 further comprising two matching capacitors.

16. The power amplifier of claim 14, wherein at least one of the extended inductor branches has a length greater than a length of each of the symmetrically embedded inductor branches.

17. The power amplifier of claim 14, wherein at least one of the extended inductor branches has a length in the range of approximately 40 µm to approximately 120 µm.

18. The power amplifier of claim 14, wherein the extended inductor branches form a common mode tuning branch and the symmetrically embedded inductor branches form a differential mode tuning branch.

19. A massive MIMO system comprising a power amplifier including:
- a single 1:1 transformer including two symmetrically embedded inductor branches;
- three harmonic tuning capacitors electrically coupled to the transformer and configured to provide third-order harmonic impedance tuning in a differential mode; and
- two extended inductor branches electrically coupled to the transformer and configured to provide second-order harmonic impedance tuning in ae common mode.

* * * * *